United States Patent [19]
Davis et al.

[11] Patent Number: 5,862,669
[45] Date of Patent: Jan. 26, 1999

[54] THERMOELECTRIC WATER CHILLER

[75] Inventors: S. Spence Davis, Atlanta; Dale C. Thomas, Lilburn, both of Ga.

[73] Assignee: Springwell Dispensers, Inc., Atlanta, Ga.

[21] Appl. No.: 601,965

[22] Filed: Feb. 15, 1996

[51] Int. Cl.$^6$ .................................................. F25B 21/02
[52] U.S. Cl. .............................. 62/3.64; 62/208; 62/209; 62/389
[58] Field of Search .............................. 62/201, 209, 208, 62/389, 390, 3.64, 3.63, 397, 212

[56] References Cited

U.S. PATENT DOCUMENTS

| | | |
|---|---|---|
| 1,586,745 | 6/1926 | Hulse .......................................... 62/201 |
| 1,856,982 | 5/1932 | West . |
| 1,930,220 | 10/1933 | Askin . |
| 2,018,389 | 10/1935 | Wagner . |
| 2,186,900 | 1/1940 | Dick et al. . |
| 2,223,159 | 11/1940 | Vose . |
| 2,225,932 | 12/1940 | Shaw . |
| 2,226,271 | 12/1940 | Vose . |
| 2,355,014 | 8/1944 | Schom . |
| 2,377,926 | 6/1945 | Dreier . |
| 2,382,365 | 8/1945 | Carssow . |
| 2,540,343 | 2/1951 | Muffly . |
| 2,622,923 | 12/1952 | Cobb . |
| 2,638,839 | 5/1953 | Raiteri . |
| 2,647,378 | 8/1953 | Rabjohn . |
| 2,657,554 | 11/1953 | Hull . |
| 2,744,660 | 6/1956 | Jacobs . |
| 3,088,289 | 5/1963 | Alex . |
| 3,120,108 | 2/1964 | Pansing . |
| 3,141,573 | 7/1964 | Patch et al. . |
| 3,149,471 | 9/1964 | Boehmer et al. ........................ 62/3.64 |
| 3,188,827 | 6/1965 | Wayne . |
| 3,255,609 | 6/1966 | Jacobs et al. . |
| 3,280,577 | 10/1966 | Kobayashi et al. . |
| 3,296,806 | 1/1967 | Gonzalez . |
| 3,327,485 | 6/1967 | Ter Bush . |
| 3,333,438 | 8/1967 | Benua et al. . |
| 3,341,077 | 9/1967 | Gordon . |
| 3,360,956 | 1/1968 | Gordon . |
| 3,698,603 | 10/1972 | Radcliffe . |
| 3,811,294 | 5/1974 | Taylor . |
| 3,822,560 | 7/1974 | Hansen et al. . |
| 3,822,565 | 7/1974 | Arzberger . |
| 3,881,901 | 5/1975 | Williams . |
| 4,008,832 | 2/1977 | Rodth . |
| 4,061,184 | 12/1977 | Radcliffe . |
| 4,109,481 | 8/1978 | Peek . |
| 4,232,528 | 11/1980 | Behr . |
| 4,270,673 | 6/1981 | Rodth . |

(List continued on next page.)

FOREIGN PATENT DOCUMENTS

WO 93/08432  4/1993  WIPO .
WO 93/08433  4/1993  WIPO .

*Primary Examiner*—John M. Sollecito
*Attorney, Agent, or Firm*—Cushman Darby & Cushman Intellectual Property Group of Pillsbury Madison & Sutro LLP

[57] ABSTRACT

A thermoelectric water chiller system for cooling fluids, and including a cold sink which defines quiescent areas where convection currents are minimized to facilitate ice formation around the cold sink is provided. The cold sink cooperates with water held in a sealed tank. A cover member which covers the cold sink can be employed which would cooperate with the tank to form a fluid-tight seal therewith. Components needing periodic cleaning are preferably removable from the system, but the tank could be permanently installed. A fan-cooled thermoelectric module assembly is used to form the ice block adjacent the bottom of the tank which chills the water. A variable-speed fan and current to the thermoelectric module are controlled by a control circuit with inputs from various temperature sensors positioned on and within various portions of the chiller system, including sensors to monitor ambient air temperature about the chiller system. Based upon sensed temperatures, or combinations thereof, the control circuit can slow the fan speed, reduce current to the thermoelectric module, or both, when chilling to a desired temperature is achieved, and to maintain the ice block at an optimum size.

8 Claims, 16 Drawing Sheets

U.S. PATENT DOCUMENTS

| | | |
|---|---|---|
| 4,274,262 | 6/1981 | Reed et al. . |
| 4,320,626 | 3/1982 | Donnelly . |
| 4,379,227 | 4/1983 | Kovacs . |
| 4,384,512 | 5/1983 | Keith . |
| 4,450,691 | 5/1984 | Taylor . |
| 4,497,179 | 2/1985 | Iwans . |
| 4,593,533 | 6/1986 | Alsenz . |
| 4,629,096 | 12/1986 | Schroer et al. . |
| 4,681,611 | 7/1987 | Bohner . |
| 4,721,232 | 1/1988 | Federighi . |
| 4,744,220 | 5/1988 | Kemer et al. . |
| 4,779,426 | 10/1988 | Desrosiers . |
| 4,792,059 | 12/1988 | Kemer et al. . |
| 4,804,118 | 2/1989 | Mullen et al. . |
| 4,829,771 | 5/1989 | Koslow et al. . |
| 4,833,888 | 5/1989 | Kerner et al. . |
| 4,840,033 | 6/1989 | Garland . |
| 4,843,830 | 7/1989 | Haul . |
| 4,860,551 | 8/1989 | Query . |
| 4,888,957 | 12/1989 | Chmielewski ............................ 62/212 |
| 4,913,713 | 4/1990 | Bender et al. . |
| 4,934,150 | 6/1990 | Fessler . |
| 4,958,747 | 9/1990 | Sheets . |
| 4,993,229 | 2/1991 | Baus et al. . |
| 4,996,847 | 3/1991 | Zickler . |
| 5,000,009 | 3/1991 | Clanin ...................................... 62/212 |
| 5,071,595 | 12/1991 | Burrows . |
| 5,072,590 | 12/1991 | Burrows . |
| 5,073,312 | 12/1991 | Burrows . |
| 5,085,810 | 2/1992 | Burrows . |
| 5,160,461 | 11/1992 | Burrows . |
| 5,172,832 | 12/1992 | Rodriquez, Jr. et al. . |
| 5,192,004 | 3/1993 | Burrows . |
| 5,209,069 | 5/1993 | Newman . |
| 5,246,141 | 9/1993 | Burrows . |
| 5,289,951 | 3/1994 | Burrows . |
| 5,297,700 | 3/1994 | Burrows et al. . |
| 5,307,958 | 5/1994 | Burrows . |
| 5,310,088 | 5/1994 | Burrows . |
| 5,370,276 | 12/1994 | Burrows . |
| 5,390,826 | 2/1995 | Burrows . |
| 5,449,093 | 9/1995 | Burrows . |
| 5,464,127 | 11/1995 | Burrows . |
| 5,501,077 | 3/1996 | Davis et al. . |
| 5,590,532 | 1/1997 | Bachman ................................. 62/389 |

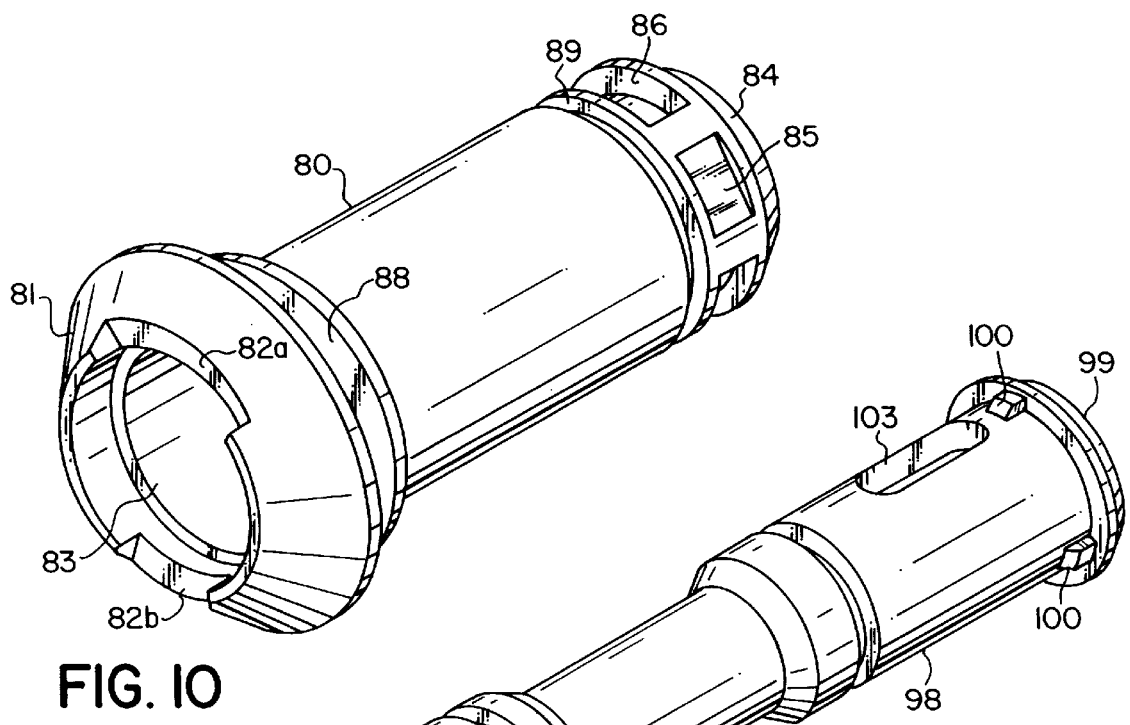
FIG. 10
FIG. 11
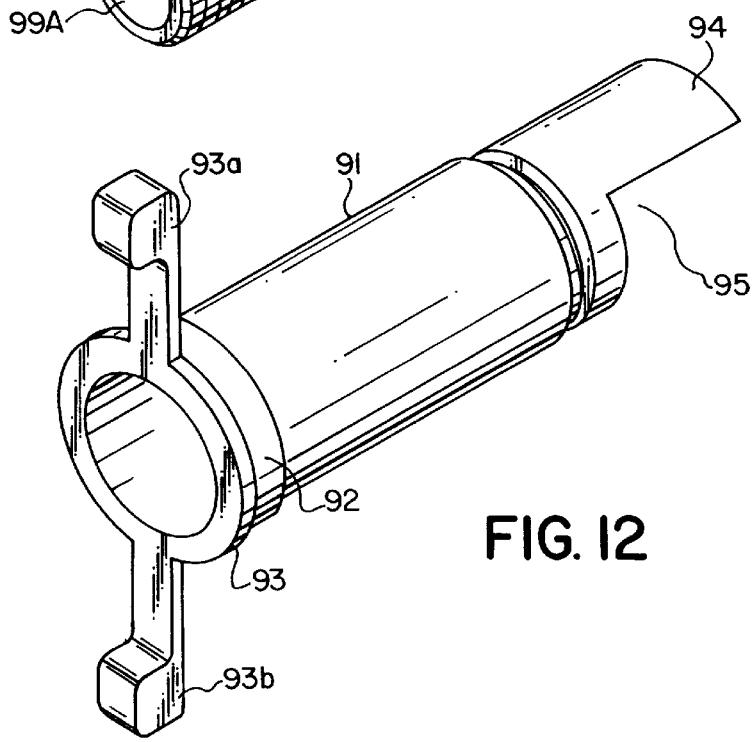
FIG. 12

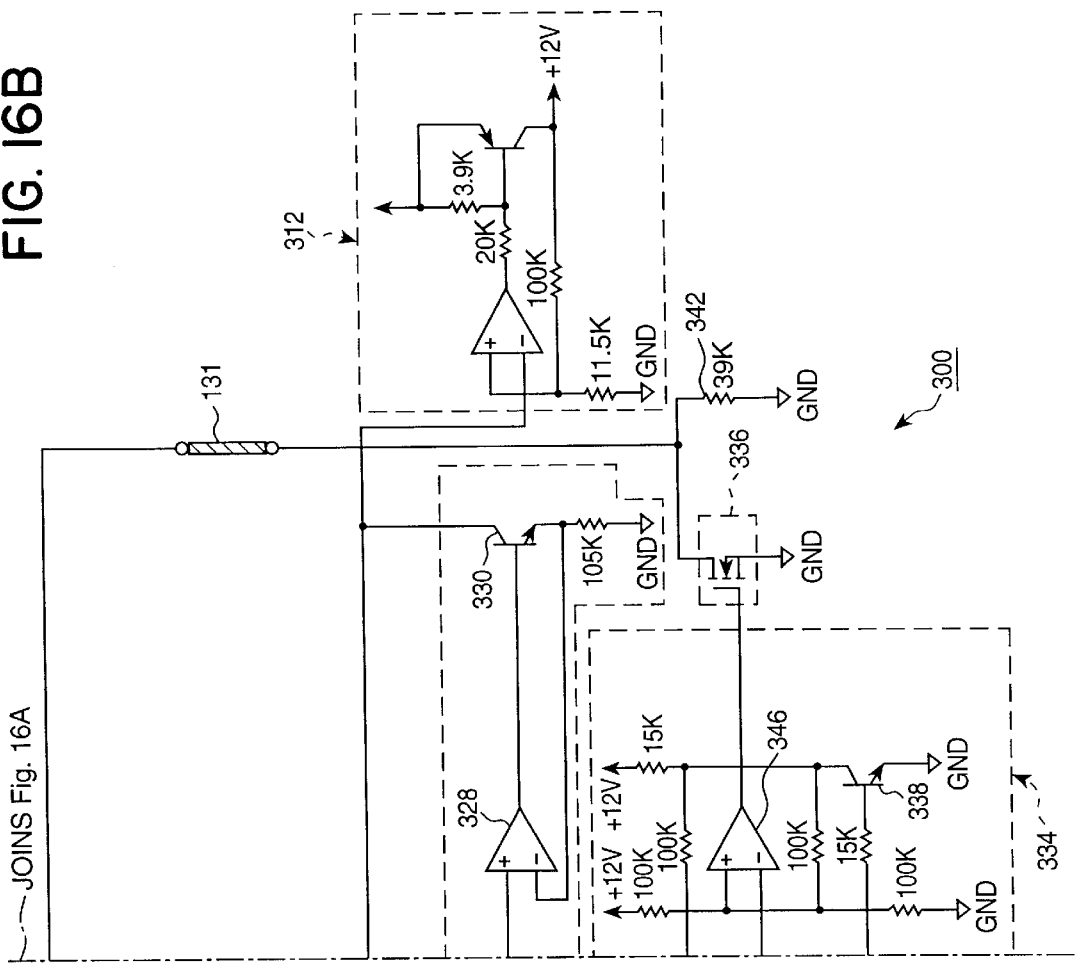

THERMOELECTRIC WATER CHILLER

BACKGROUND OF THE INVENTION

1. Field of the Invention

This invention relates to an improved system for chilling drinking water, the system being particularly suitable for cooling and dispensing bottled drinking water. Water cooling is preferably provided by a thermoelectric heat-transfer module that provides controlled ice block formation. The system is efficient, quiet and trouble-free as compared to compressor-type coolers.

2. Related Art

Due to concern over the quality of water from public systems, use of bottled water and water filters, and associated dispensers, is becoming more prevalent. Many individuals have realized the desirability of dispensing cooled rather than having only room temperature water. Various approaches have been utilized to cool the water.

For example, a conventional refrigerant circuit with a compressor, evaporator and condenser has been employed. Water in a dispenser has also been cooled with a thermoelectric module as disclosed in allowed U.S. patent application Ser. No. 08/250,364, now U.S. Pat. No. 5,501,077. Also, a cold sink, extending into a water tank, has been employed to transfer heat from the water to the thermoelectric module as disclosed in U.S. patent application Ser. No. 08/452,179, which is a continuation in part of the above-mentioned application. Heat is drawn from the water into a heat sink from which it is dissipated to the ambient environment. Preferably, an ice block forms on the cold sink and cools the water in the tank. Ice stores energy of the thermoelectric module to more efficiently cool an influx of warmer water.

PCT publication number WO93/08432 discloses a cooling dispenser having an ice producing means which comprises a thermoelectric module sandwiched between a cold side sink and a hot side sink. An infrared beam detects ice formation on the cold side sink, and when the ice formed grows large enough to block the beam, the cooling system is shut down and the ice is permitted to melt sufficiently to be dislodged from the cold side sink. The dislodged ice floats to the top of the tank and the system restarts to form more ice. The upper surface of the cold side sink is preferably concave with smoothly tapered sides so that the ice will release easily therefrom when the cooling system is shut down.

Several problems exist with water dispensers that employ ice block formation as the cooling medium. For example, it is sometimes difficult to control the dimensions of the ice block being formed. If the ice block extends outwardly enough to actually contact the dispenser spigot, the spigot can become plugged by ice. Also, fans used in chiller systems, including those used to cool the heat sinks, can generate unwanted noise. Another problem exists with chiller systems utilizing fans in that where such fans are allowed to operate at or near full speed conditions, noise generated as a result can be unwanted, is perhaps unnecessary and undesirable. In some systems, internal tank components cannot be removed to facilitate cleaning. Finally, although some water chilling dispensers provide for dispensing both chilled and unchilled water, this is accomplished through two separate valves, which may not be ideal aesthetically and does not permit pre-dispensing mixing of water of different temperatures.

Another problem relates to the formation of ice around either a vertically extending cooling probe assembly within the tank, where such a mechanism is used, or around a vertically extending cooling plate at the bottom of the tank. Room temperature or warmer water is most usually introduced at the top of the tank. Water in the lower portion of the tank is cooled adjacent the bottom of the tank. This temperature differential between the top and bottom areas of the tank causes convection currents, which can inhibit ice formation or make the ice forming process inefficient.

SUMMARY OF THE INVENTION

The present invention addresses these and other problems associated with known water dispensers. The water chiller of this invention has a thermally insulated outer housing which supports a removable main tank. A thermal barrier is fitted in the tank to define upper and lower chambers. Water from the upper chamber is gradually fed into the lower chamber as water from the lower chamber is dispensed. A user-adjustable proportioning valve enables dispensed water to be drawn from both the upper and lower water chambers in a proportion which provides a desired water temperature.

An ice block forming assembly has a thermoelectric module in contact with a cold sink and a finned hot sink from which heat is dissipated, for example, by fan-driven room temperature air that is moved across the finned heat sink from one end to another. The cold sink is in heat exchange contact with fluid in the lower chamber of the main tank. The operating rate of this cooling system can be controlled in a variety of ways. For example, fan speed and/or power to the thermoelectric module can be varied. This variation can be based on sensed temperatures within or adjacent the dispenser including, for example, ambient air temperature, hot or cold sink temperatures, or other temperatures at various locations within the dispenser. This could also include monitoring the temperatures within the upper and/or lower chambers. Such temperature sensing can also include combinations of temperatures at two or more of the above locations. Such sensed temperatures can be employed, in turn, to provide signals that allow a control circuit to regulate the size of an ice block forming in the lower chamber.

In a preferred embodiment of the present invention, the ice block forming assembly includes a cold sink in contact with the thermoelectric module. The cold sink, preferably formed or molded from a suitable heat conducting metal, such as, for example, aluminum, copper, or stainless steel, includes a unique convection current preventing structure which defines a quiescent region in which thermal convection currents are substantially inhibited to facilitate better ice formation. The cooling assembly also includes a water seal between the cold sink and the tank so that the tank is a fluid-tight container. The water seal preferably comprises a cover member that is force fit over the cold sink, so as to define an airtight interfit where the cover and cold sink come into contact. This tight fit provides a good thermal exchange path between the cold sink and water in the tank. Suitable seals are provided between the cover member and the tank structure and a cut out area prevents any air lock from forming so that suction will not prevent cover removal.

The cold sink preferably includes an open area formed therein. With the cover member in place over the cold sink, an airspace is defined by the open area between the cold sink and the cover member. The ice block that forms around the cold sink is not as thick proximate the area of the airspace as compared to the size of the ice block forming on the rest of the cold sink. The cold sink is oriented within the water chiller such that the area of the air space faces the inlet of the dispensing valve. As a result, the ice block does not block water from exiting the valve.

Other objects, features and characteristics of the present invention along with the method of operation and assembly will be appreciated from study of the following detailed description and the appended claims and drawings, all of which form part of this application and wherein like reference numerals designate corresponding parts in the various figures.

BRIEF DESCRIPTION OF THE DRAWINGS

FIG. 10 is a perspective view of an outer sleeve of the valve assembly;

FIG. 11 is a perspective view of an inner sleeve of the valve assembly;

FIG. 12 is a perspective view of a rotatable intermediate sleeve of the valve assembly;

DESCRIPTION OF THE PRESENTLY PREFERRED EXEMPLARY EMBODIMENTS

Figure 1:
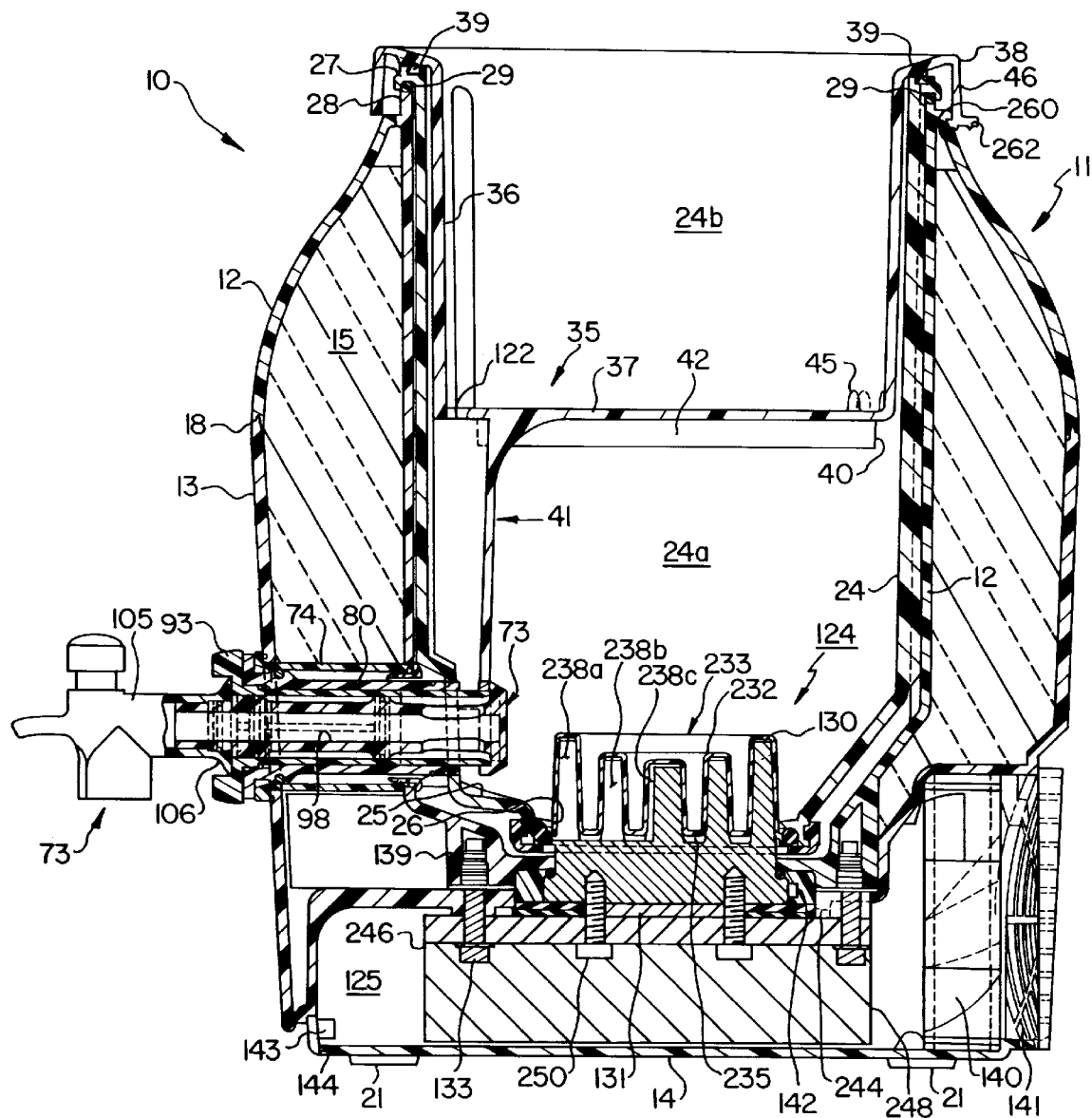
FIG. 1 is a sectional elevation of a thermoelectric water-chiller system according to a preferred embodiment of the present invention.
Figure 2:
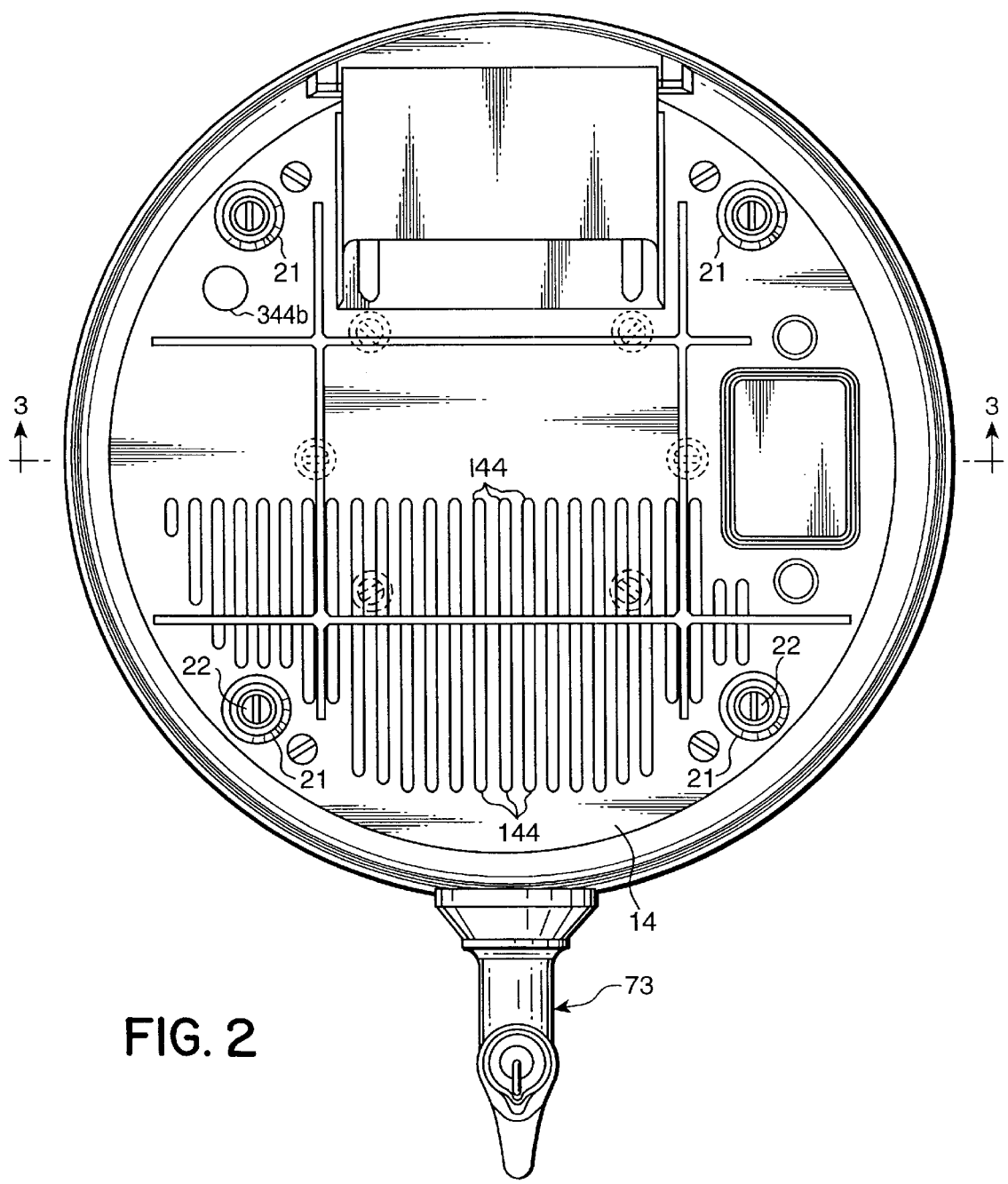
FIG. 2 is a bottom view of the preferred embodiment.

A first embodiment of a water-chiller and dispenser system 10 is shown in FIGS. 1–3. The system disclosed is a modification of the systems disclosed in commonly owned co-pending U.S. patent application Ser Nos. 08/250,364 and 08/452,179, the respective disclosures of which are hereby incorporated by reference.

The water chiller and dispenser system has a double-walled and generally cylindrical outer housing 11 including an upper shell 12, a lower shell 13, and a circular base panel 14. The upper and lower shells 12 and 13 together define an enclosed annular space 15 which is preferably filled with a thermal insulating material such as, for example, a polyurethane or polystyrene foam material. The shells 12 and 13 are shown as being joined together at an outer annular joint 18 but could be molded in other arrangements. The system 10 is supported, for example, on four feet 21, which serve two purposes on the dispenser. The feet separate the system from a surface upon which the system rests, and also can be used to connect the system to a dispenser stand.

Figure 8:
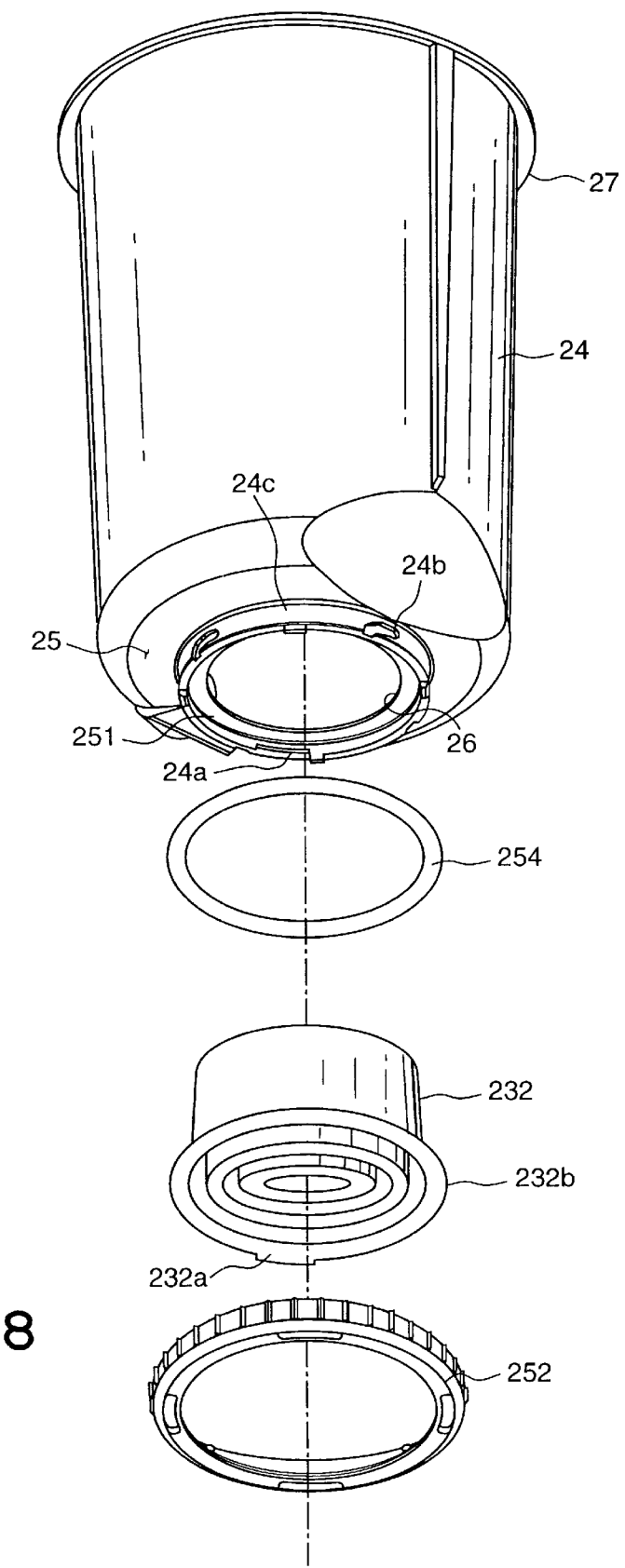
FIG. 8 is an exploded perspective view illustrating the tank assembly of the present invention.

A generally cylindrical main tank 24, for holding chilled water, has an inwardly tapered bottom portion 25 defining a central circular opening 26 (see also FIG. 8). The upper end of tank 24 has a radially outwardly extending annular lip 27 which seats on or adjacent an upper end 28 of upper shell 12 when the tank is fitted within the housing as shown in FIG. 1 depending upon the amount of compression of a resilient seal ring 29, for example an O-ring, positioned between annular lip 27 and the upper end 28. Ring 29 is provided to prevent water or water vapor from entering the space between main tank 24 and housing 11.

Figure 6:
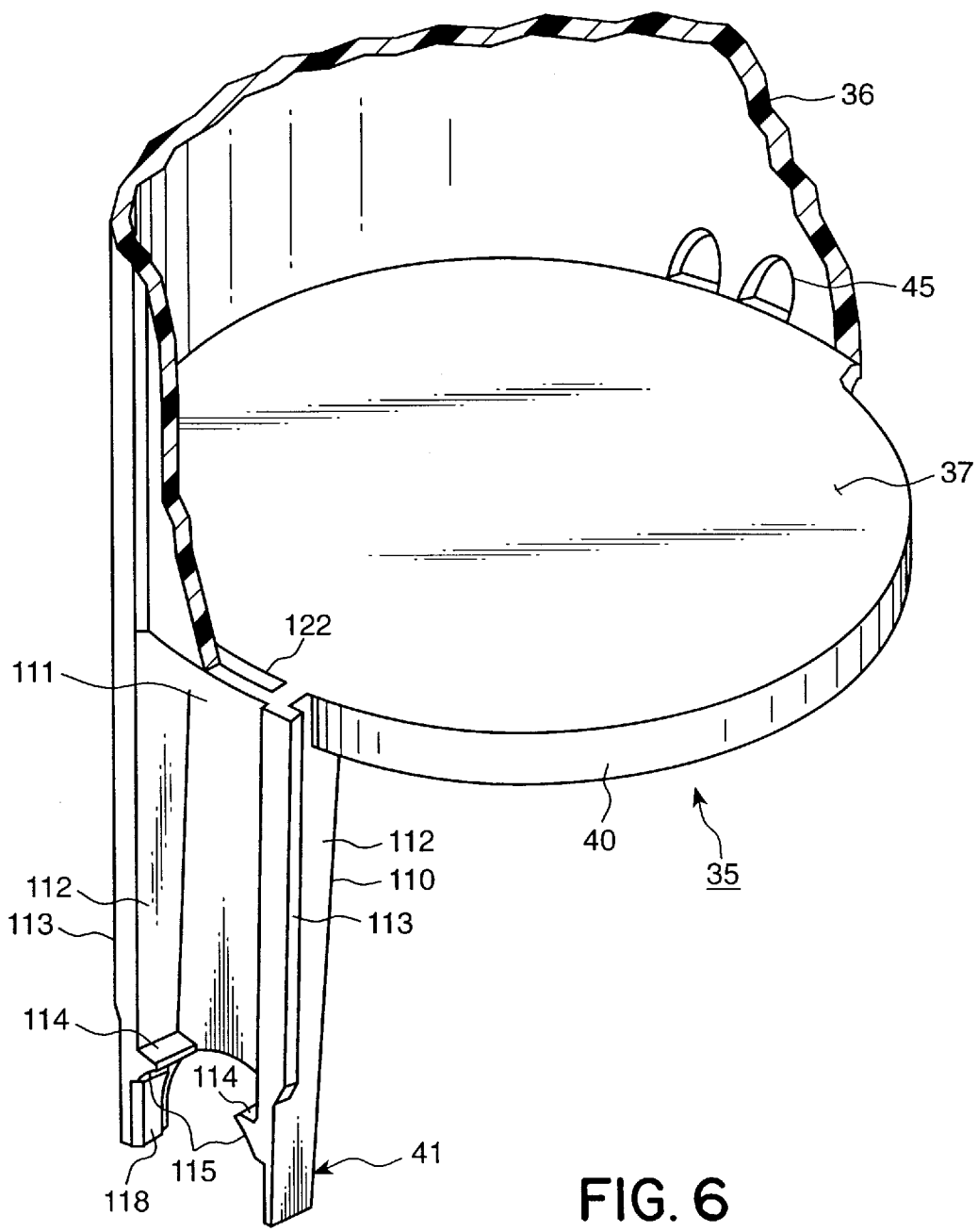
FIG. 6 is a partial perspective view of a bottom cover and internal water channel portion of a thermal-barrier of the system.

A thermal barrier 35, also shown in greater detail in FIG. 6, is preferably fitted within the upper end of main tank 24 to divide the main tank to form a lower chamber 24a and an upper chamber 24b. The thermal barrier 35 minimizes heat transfer between chilled water in the lower chamber 24a and relatively warmer water in the upper chamber 24b. As shown in FIGS. 1 and 6, thermal barrier 35 has a generally cylindrical upwardly extending sidewall 36, a bottom wall 37, and a lower depending water channel assembly, generally indicated at 41, that extends downwardly from bottom wall 37 to interfit with the discharge valve 73. An outwardly and downwardly extending annular lip 38 extends from the upper end of sidewall 36 to overhang and rest against the upper end of the main tank 24. A resilient seal 39 may also be provided between main tank 24 and thermal barrier 35, for example, at the top of main tank 24.

A depending skirt 40 can be provided around the periphery of bottom wall 37. When the lower chamber 24a is filled with water, air becomes trapped in space 42 defined by skirt 40, as the lower chamber 24a fills with water, and acts as additional thermal insulation between the lower and upper chambers.

A conventional five-gallon water bottle (not shown) is inverted and supported on annular lip 38 of the thermal-barrier. Bottled water at room temperature thus fills the upper chamber 24b of system 10 within sidewall 36 above bottom wall 37, and is admitted to a lower chamber 24a of main tank 24 through sidewall openings 45.

In an alternative form, sidewall 36 can be replaced with a series of struts (not shown) between which water can flow around the thermal barrier (which can be enlarged in diameter) and into the lower chamber.

In either case, the desired effect is to maintain stratification of the warmer water and chilled water, and thereby to achieve more rapid chilling of water in the lower part of the main tank as well as provide independent sources of relatively warmer and cooler water. Use of a plurality of relatively small flow passages from the upper chamber to the lower chamber provides low-velocity admission of warmer water to minimize swirling and mixing of water in the lower chamber as chilled water is being dispensed.

The preferred embodiment of the present invention includes a proportioning valve assembly 73 (FIGS. 1 and 9–14) which enables dispensing of chilled water from the lower chamber only, warmer water from the upper chamber only, or a selectable mixture of chilled and warmer water from both the upper and lower chambers. The valve assembly 73 extends through and is supported by a horizontally positioned cylindrical outer tube 74 which extends through openings 75 and 76 in upper and lower shells of the housing, interfits with the water channel assembly 41, and is clamped in place by an inner snap-in retaining ring 77 fitted against an O-ring seal 78.

Figure 13:
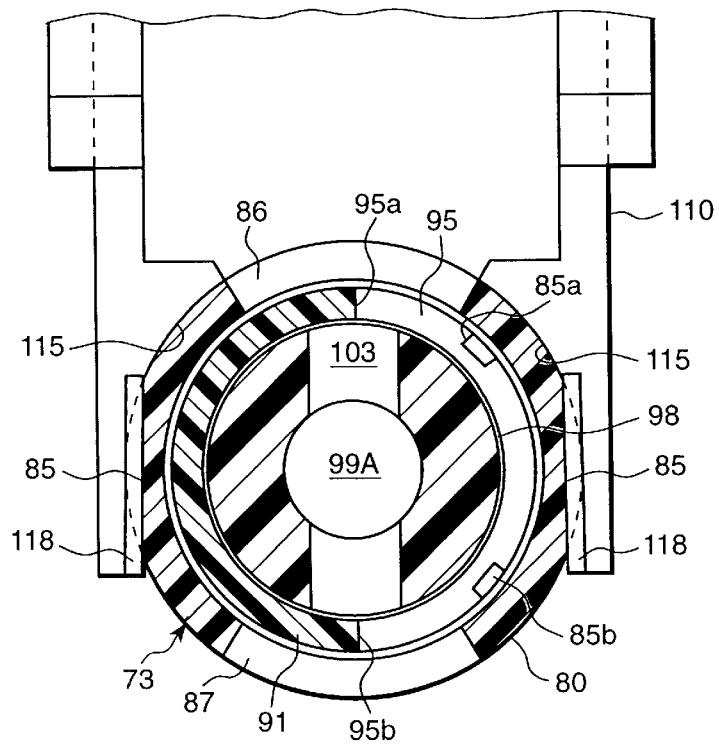
FIG. 13 is a sectional view on line 13—13 of FIG. 9.

The valve assembly 73 includes a cylindrical outer sleeve 80 (FIGS. 9–10) with an enlarged head 81 at its outer end. A bore 83 extends axially through the sleeve, and the diameter of the bore is slightly decreased as it passes through an inner end wall 84. A pair of oppositely oriented keyway slots 85 spaced at 180° are formed in the end wall. A pair of oppositely oriented upper and lower rectangular ports 86 and 87, best shown in FIG. 13, are spaced at 180°, and formed through the sidewall of the outer sleeve adjacent the end wall. Annular grooves 88 and 89 shown in FIG. 10 are provided on the sleeve outer surface to receive O-ring seals. While a single groove is shown at reference number 89, two parallel, closely spaced grooves could be provided to accommodate two O-rings. Rotation stops 85a, 85b extend radially inwardly from the inner surface of bore 83 and are circumferentially spaced approximately about 90° to 100°, (FIGS. 13 and 14).

A rotatable intermediate sleeve 91 (FIGS. 9 and 12) makes a slip fit within bore 83 of the outer sleeve 80, and has at its outer end a radially extending shoulder 92 which seats in a mating recess in head 81 of the outer sleeve. A radially extending flange 93 is located at the far outer end of sleeve 91. One or more O-rings seal between intermediate sleeve 91 and outer sleeve 80. While an O-ring groove is shown in FIG. 12 mid-way along sleeve 91, the O-ring could be employed between the inner surface of shoulder 92 and the mating portion of sleeve 80. A pair of diametrically opposed rotation arms 93a, 93b extend radially from flange 92. The intermediate sleeve has an inner or rear portion 94 that extends along about a 180° arc. A cutout 95 is formed in the sidewall of this portion adjacent the inner end of the sleeve. Cutout 95 defines edges 95a, 95b, which engage rotation stops 85a, 85b, respectively, to restrict rotation of intermediate sleeve 91 within outer sleeve 80. (FIGS. 13 and 14).

Figure 14:
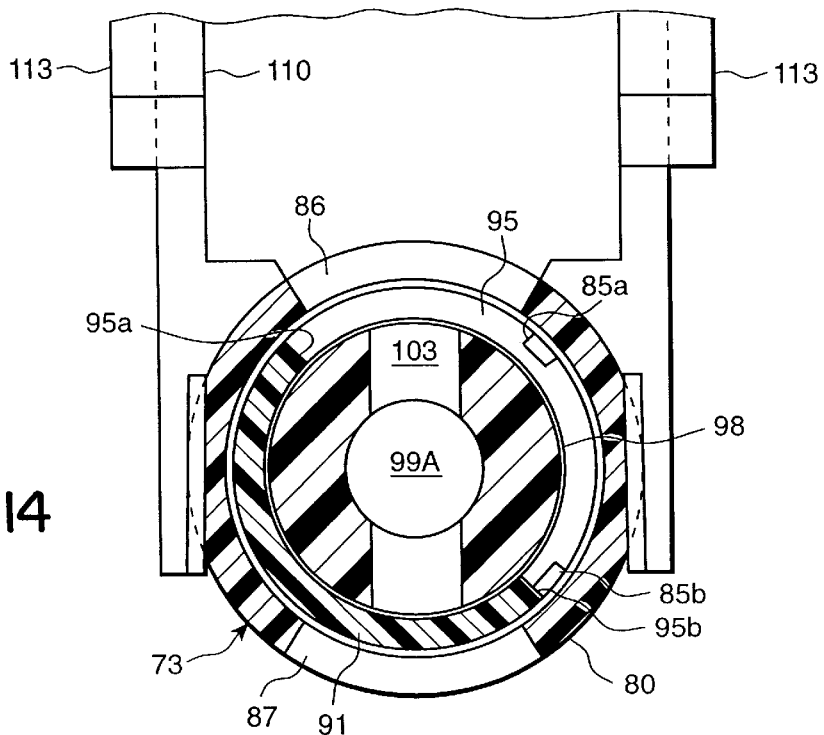
FIG. 14 is a view similar to FIG. 13 showing the rotatable sleeve of the valve assembly in a different position.

Alternatively, or additionally, stops 93c and 93d could be provided on the inner side of flange 93 which engage cutouts 82a and 82b, respectively, to restrict rotation of intermediate sleeve 91 within outer sleeve 80, (FIGS. 13 and 14). In the broadest aspects of the present invention, however, means for restricting rotation of intermediate sleeve 91 within outer sleeve 80 could be omitted from valve assembly 73 to permit sleeve 91 to freely rotate.

A fixed-position inner sleeve 98 (FIGS. 9 and 11) makes a slip fit within the intermediate sleeve 91, and has at its inner end an enlarged headed end 99 which seats against the inner end of outer sleeve 80. Appropriately positioned O-rings seal the inner sleeve 98 to intermediate sleeve 91. A bore 99A extends through the inner sleeve to terminate at the headed end 99. Three 120°-spaced lugs or keys 100 extend axially from the inner side of the head, and are positioned to mate with keyway slots 101 (FIG. 9) in the end wall of the outer sleeve. A pair of 180°-spaced opposed ports 103 extend through the sidewall of the inner sleeve into bore 99A adjacent headed end 99.

An outer end 104 of sleeve 98 is threaded to receive a conventional dispensing valve or spigot 105 (FIG. 9) having at its inner end a flange 106 which is positioned immediately adjacent or against the enlarged flange 93 of intermediate sleeve 91. The outer sleeve 80 and intermediate sleeve 91 are thus clamped between flange 106 and enlarged head 99 at the inner end of inner sleeve 98, enabling valve assembly 73 to be inserted into or withdrawn from the housing as a unit. Flange 93 of intermediate sleeve 91 is dimensioned to make a slip fit against flange 106 of the spigot to permit rotation of the intermediate sleeve. The inner portion of the valve assembly extends through a circular opening 108 (FIG. 9) formed in the lower sidewall of tank 24 to position lower port 87 of outer sleeve 80 in communication with chilled water in the tank.

Figure 9:
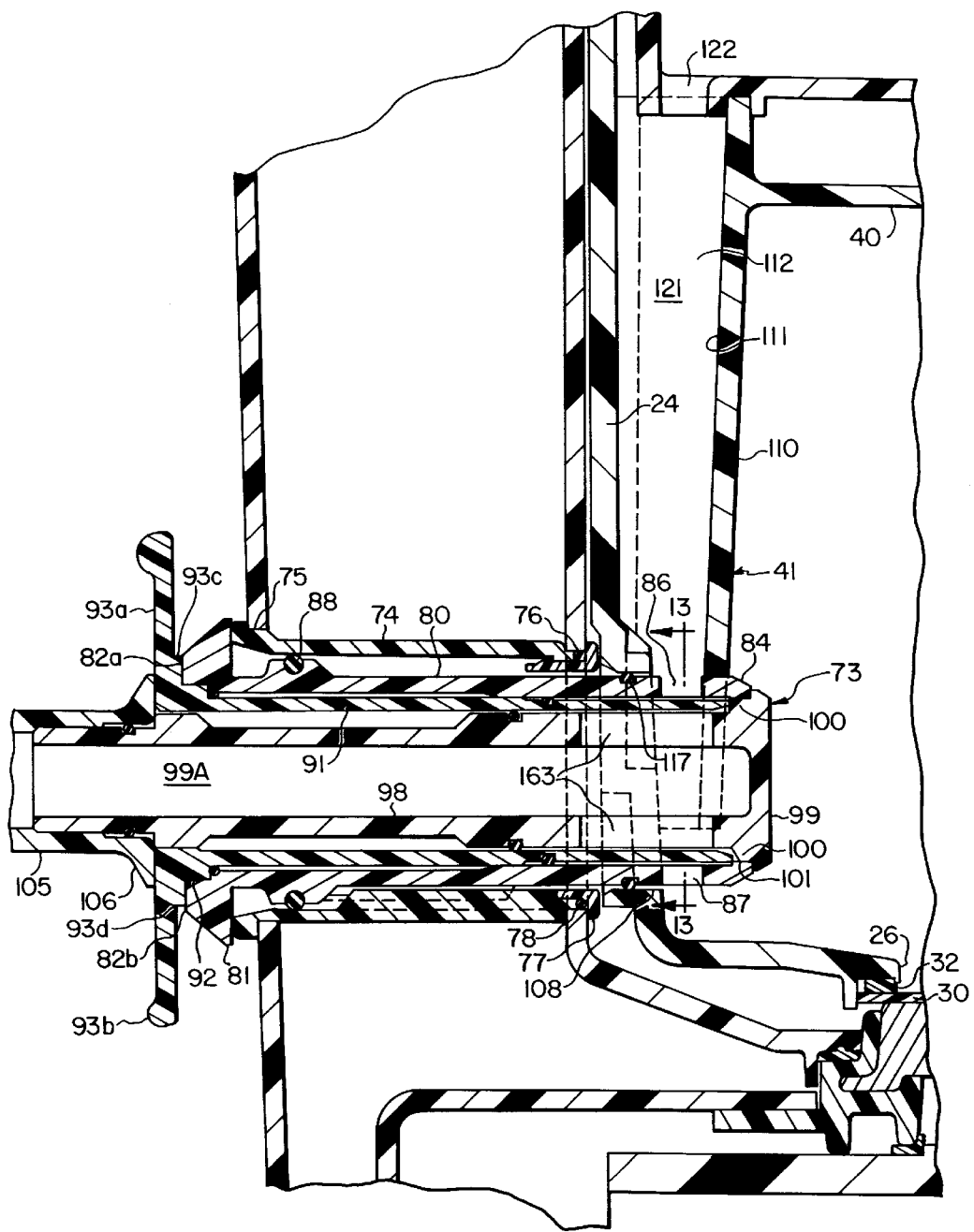
FIG. 9 is an enlarged sectional elevation of a proportioning valve assembly.

The depending water channel assembly 41 includes a vertical wall structure 110 (FIGS. 6 and 9) that is integrally formed with and extends downwardly from one side of bottom cover 37 of thermal-barrier 35. Wall structure 110 performs the dual functions of conveying warmer water from above the thermal-barrier to valve assembly 73, and clamping the inner end of the valve assembly 73 within the lower end of tank 24. Wall structure 110 has a base 111, and a pair of radially outwardly extending and spaced-apart sidewalls 112 which define at their outer ends oppositely extending circumferential ribs 113. A pair of inwardly extending shoulders 114 are formed at a lower portion of sidewalls 112, and lower surfaces 115 of the shoulders are cylindrically curved to fit against the inner portion of outer sleeve 80. An O-ring seal 117, as shown in FIG. 9, is fitted in groove 89 around the outer sleeve to seal the valve assembly to the tank. Sidewalls 112 also define inwardly extending ribs 118 dimensioned to make a snug slip fit within keyway slots 85 of the outer sleeve.

Figure 4:
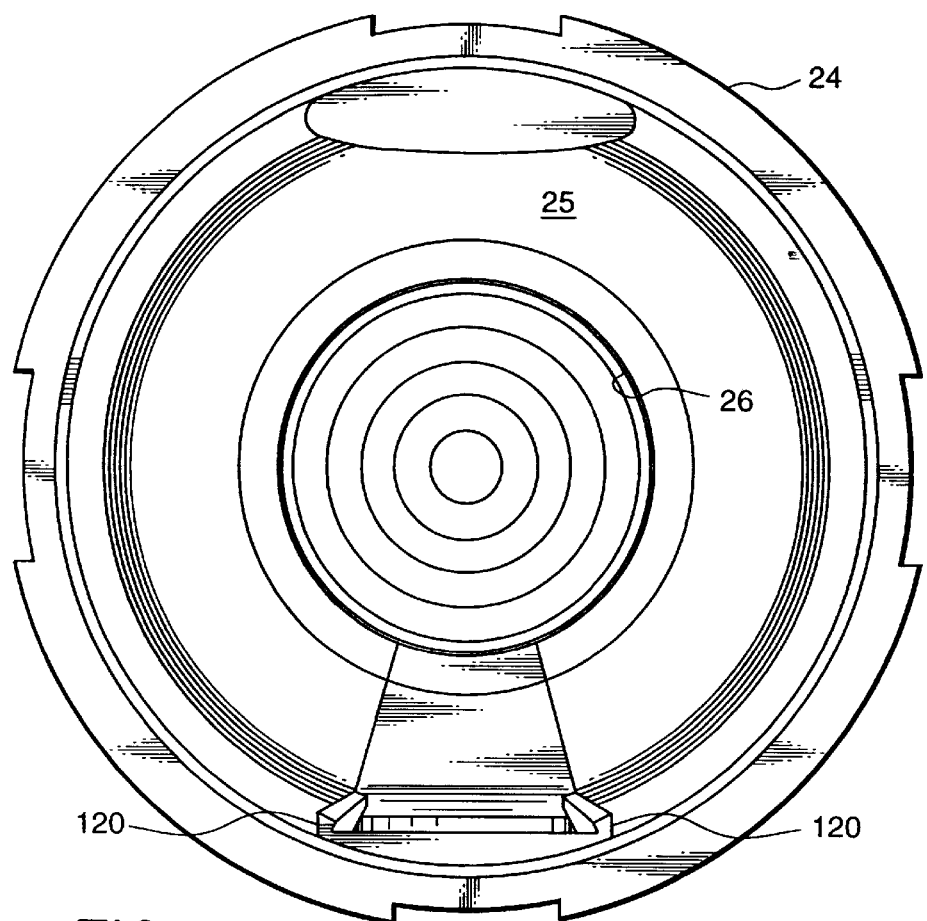
FIG. 4 is a top view of a main tank of the system.

As best seen in FIG. 4, a pair of downwardly and inwardly extending spaced-apart tapered guide ribs 120 are integrally formed in the inner surface of tank 24. Ribs 113 of the thermal-barrier 35 make a snug slip fit within the tapered and mating guide ribs 120 to provide a close fit between the channel sidewalls 112 and ribs 120 against the inner sidewall of the tank. Wall structure 110 and the tank sidewall between guide ribs 120 thus form a passageway 121, shown in FIG. 9, that permits water from the upper chamber to flow by gravity through a port 122 shown in FIGS. 1, 6, and 9 and formed through bottom wall 37 to upper port 86 of the valve-assembly outer sleeve (FIGS. 9–10).

Water is dispensed through spigot 105, and temperature of the dispensed water can be adjusted by rotating intermediate sleeve 91 of the valve assembly. The intermediate sleeve has sufficient frictional resistance to rotation to maintain a desired preset position. A mixture of warmer and chilled water is provided by positioning the sleeve as shown in the proper manner. If only warmer water is needed, the sleeve is rotated to the position shown in FIG. 14 with lower port 87 of the outer sleeve blocked, and upper port 86 fully open. Clockwise rotation of sleeve 91 to a position opposite that shown in FIG. 14 blocks the upper port, and permits chilled water to be dispensed through the lower port.

An ice forming assembly 124 (FIGS. 1, 3A, 7) is positioned in space 125 at the bottom of system 10 between base panel 14 and the lower end of outer housing 11. Assembly 124 has at its upper end a cold sink 130, preferably formed or molded of a heat conducting metal, such as, for example, aluminum, copper, or stainless steel. A hot sink in the form of an aluminum block 246 is positioned below and slightly spaced from the undersurface of cooling member 130, and a thermoelectric module 131. Commercially available types of such modules include, for example, the CP 1.4-127-06L unit supplied by Materials Electronic Products Corporation in Trenton, N.J. Module 131 is sandwiched tightly between the top of block 246 and the bottom of cold sink 130. The lower part of block 246 preferably includes a plurality of downwardly extending heat-dissipating fins 248 as traditionally used on heat sinks.

Figure 3A:
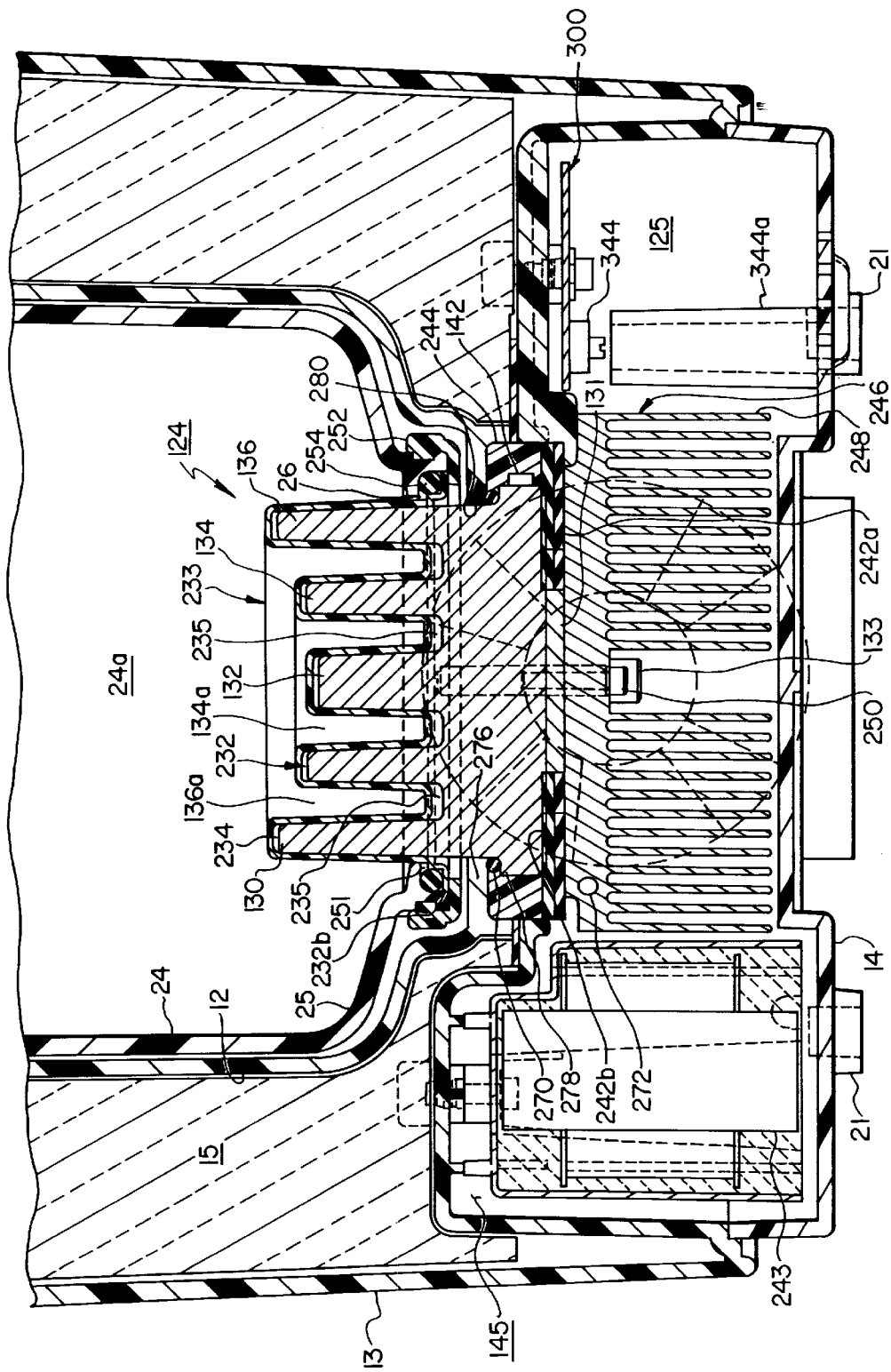
FIG. 3A is a sectional elevation on line 3—3 of FIG. 2.
Figure 7:
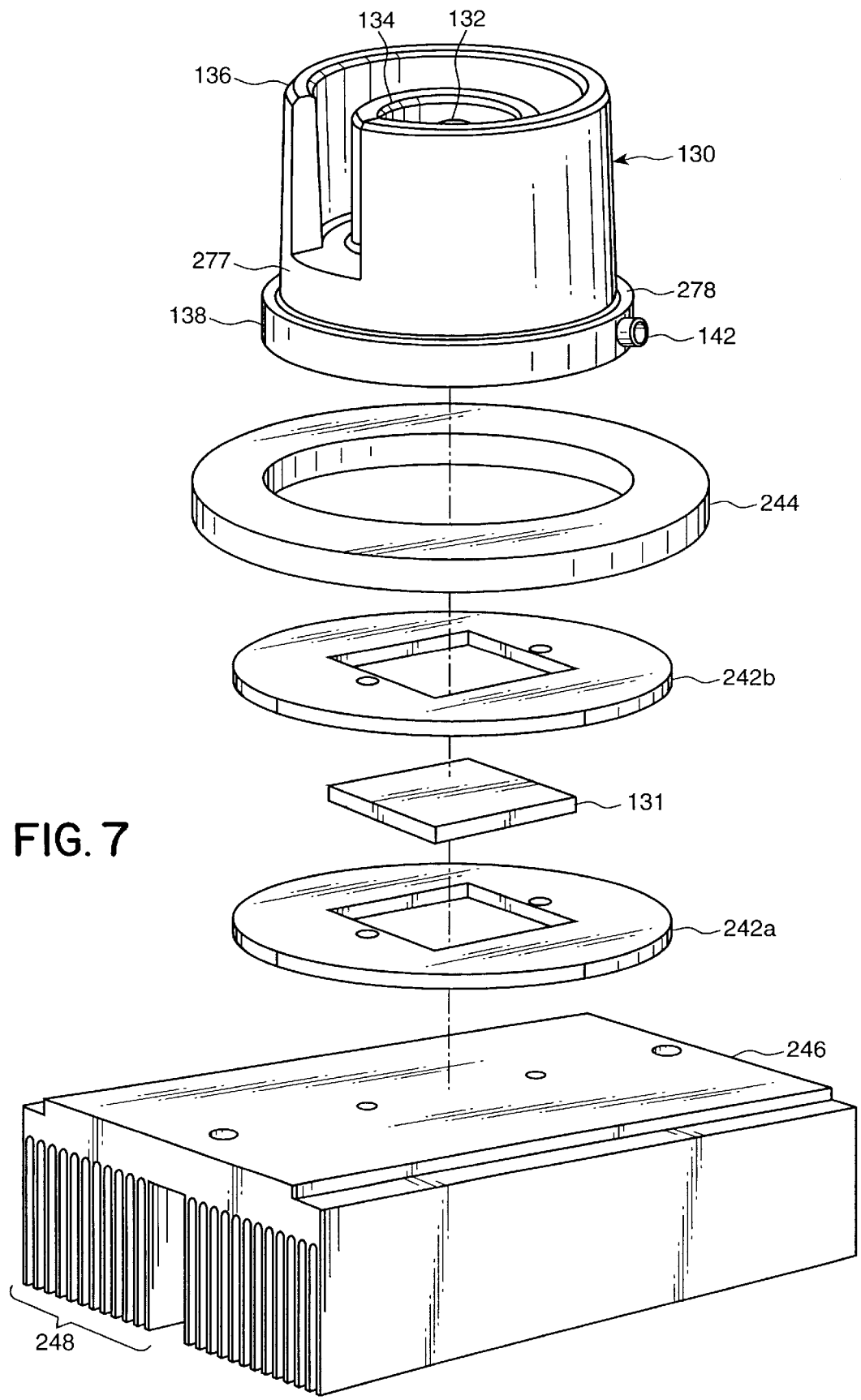
FIG. 7 is an exploded perspective view of the cold sink, thermoelectric module, and heat sink of the cooling assembly of the present invention.

A fan 140 (FIG. 1) is secured to base panel 14, and slides upwardly into a cavity formed at the lower end of outer-housing lower shell 13 when the base panel is installed. An apertured air-outlet grill 141 is supported on the lower shell adjacent the discharge side of the fan. A temperature sensor, such as a thermistor 142, is suitably secured to the cold sink 130. Other types of temperature sensors or transducers, such as a self-generating thermocouple are of course also suitable when used with compatible circuitry. As shown in FIGS. 1, 3A, and 7, the temperature sensor 142 can be positioned on the lower end of the cold sink 130, but other locations, one or more, can also be used. Outside room air is drawn by the fan through a plurality of inlet slots 144 (FIG. 2) formed through base panel 14 to pass over and along fins 248 to draw heat from those fins. Ambient temperature of that in flowing air is determined by thermistor 143, or other temperature sensor, preferably located on or adjacent inlet slots 144 or otherwise where ambient room temperatures can be sensed or alternatively, heat sink temperature could be monitored instead of ambient temperatures.

Fan 140 is of a commercially available type, including, for example, fans available from Comair Rotron, Inc., (unit no. FN12B3) in San Ysidro, Calif., or from Sanyo Denki Co. Ltd., in Japan. Fan speed, the amount of current to the thermoelectric module 131, or both can be regulated in response to the temperature sensed by thermistor 142, the ambient temperature sensed by thermistor 143, or by a combination of sensed temperatures. Preferably, power is kept on the fan motor at all times so air continuously flows to some degree across heat sink 246. At times, however, it is desirable to cut fan speed to lower levels and thereby achieve as quiet operation as possible. Further details will be discussed hereafter.

Current to the thermoelectric module 131 can also be controlled and regulated to aid in ice formation control. Current can be decreased, and fan speed automatically diminished, for example, as the difference between ambient temperature and cold sink temperature decreases, i.e., when water in the tank has been chilled and/or the room-air temperature becomes colder. Power to the thermoelectric module and/or fan speed can be correspondingly increased when a higher rate of heat dissipation is needed out of the tank or as ambient temperatures rise.

Control circuitry of the fan and the thermoelectric module can be adjusted to match a specific range of fan speeds and module power with a specific range of sensed temperatures. The speed control circuitry is built onto a circuit board, such as 300 in FIG. 3A. Thermistors 142 and 143 are connected to the circuitry to provide generated input signals that constitute the base data to continuously monitor and regulate the amount of current supplied to each or both of fan 140 and thermoelectric module 131.

Twelve-volt dc power is provided to thermoelectric module 131 and fan 140 by a transformer and rectifier assembly 243 (FIG. 3) secured to base panel 14 and positioned within a cavity 145 formed in the bottom of lower shell 13 of the outer housing. The transformer is connected to a standard ac power outlet. Cabling from the assembly 243 to the thermoelectric module 131, the control circuit 300, set forth in FIG. 16, and the fan 140 is omitted from FIGS. 3A and 3B for clarity.

The thermoelectric module 131 operates in a conventional way to draw heat from the cold sink and hence from water in the tank through cold sink 130 to be dissipated to outside room air by fins 248 which are cooled by air moved thereacross by the fan through base-panel slots 144 into the plenum surrounding the fins.

In the preferred embodiment of the present invention, in which cover 232 is provided as a water seal, cover member 232 and cold sink 130 are engaged in force fit contact so that there is a tight fit therebetween where they engage one another, except at openings 135 and 137 described below, and at the top and bottom portions of the cover. This tight fit permits cover member 232 to provide thermal exchange path between and water in the lower chamber 24a of the tank 24. In that regard, cover member 232 is kept thin, with a wall thickness of about $\frac{1}{16}$", thus further improving the thermal exchange capability of the cooling assembly.

Figure 15A:
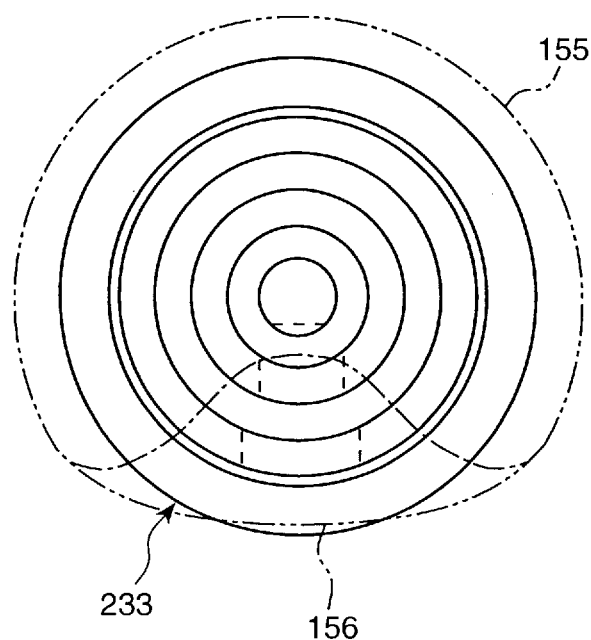
FIG. 15A is a diagrammatic top view of the cold sink illustrating the shape of an ice block formed thereon.
Figure 15B:
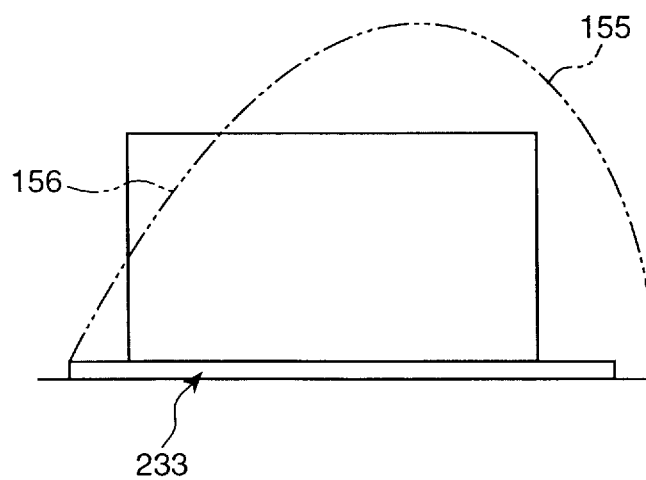
FIG. 15B is an elevation view of the cooling assembly diagrammatically illustrating the shape of an ice block formed thereon.

Ice block forming assembly 124 forms an ice block 155 (shown in phantom line in FIGS. 15A and 15B) in the bottom area of the tank for rapid chilling of room-temperature water admitted from the upper chamber 24b into the lower chamber 24a. Thermistor 142, positioned on the cold sink, and thermistor 143, positioned proximate the air inlets 144, preferably collectively, provide feedback to control circuit 300 (FIG. 16) thus allowing fan 140 and thermoelectric module 131 to be controlled to thereby control the size and formation rate of the ice block 155.

Figure 3B:
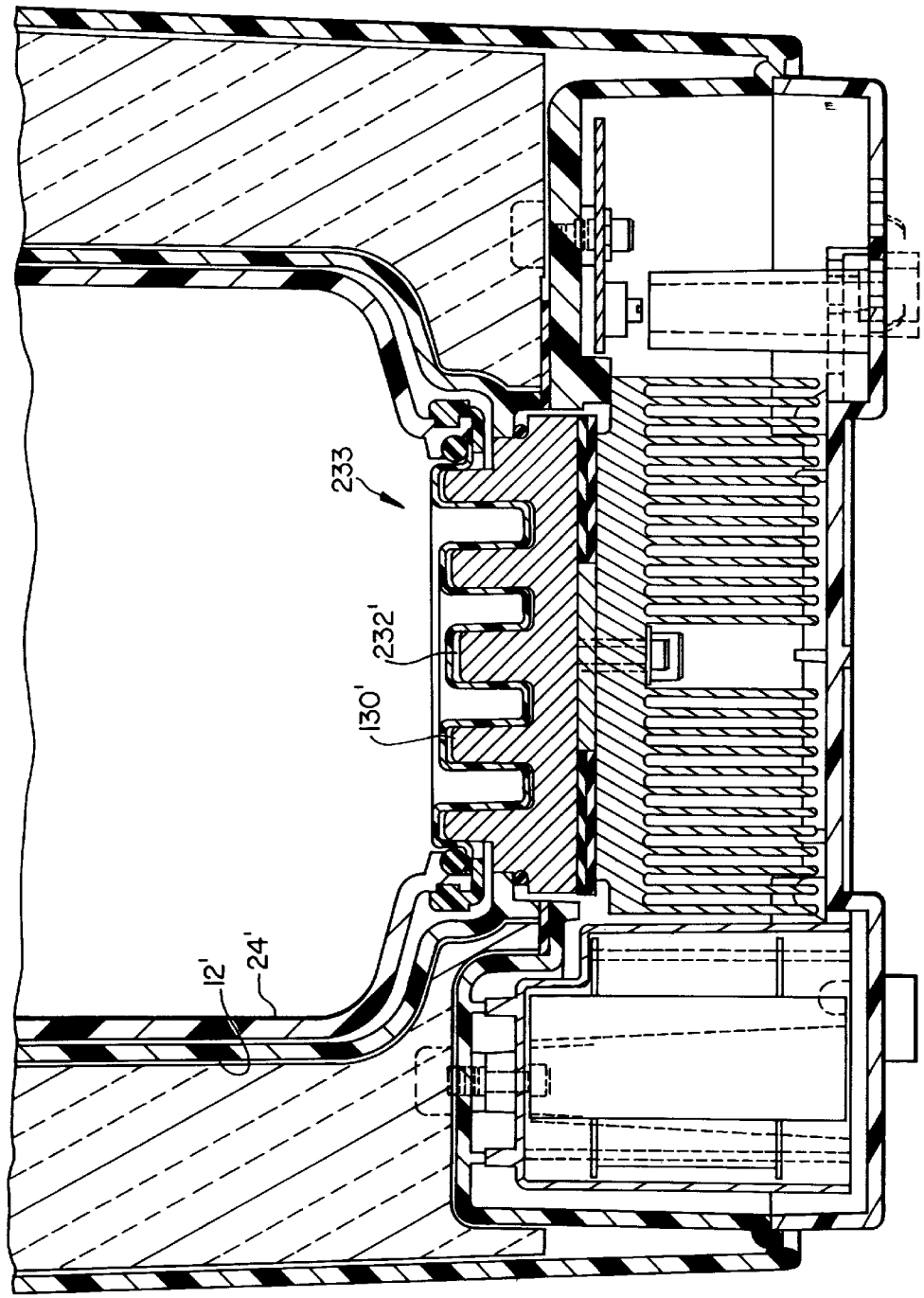
FIG. 3B is a sectional elevation of an alternative embodiment of the present invention.

As noted previously, cooling body 233 preferably includes cold sink 130 and cover member 232. Cold sink 130 fits into a matingly-shaped cover member 232, preferably molded as a separate unit of a plastic material, such as polyethylene or polypropylene. Cover member 232 is removably attached to the bottom of tank 24 as shown in FIG. 3A so that the ice block forming assembly 124 extends into the bottom area of lower chamber 24. Alternatively, as shown in FIG. 3B, the top of cold sink 130', covered by cover 232', could be disposed so that the top of cover member 232' is substantially flush with the bottom surface of tank 24'.

Figure 5:
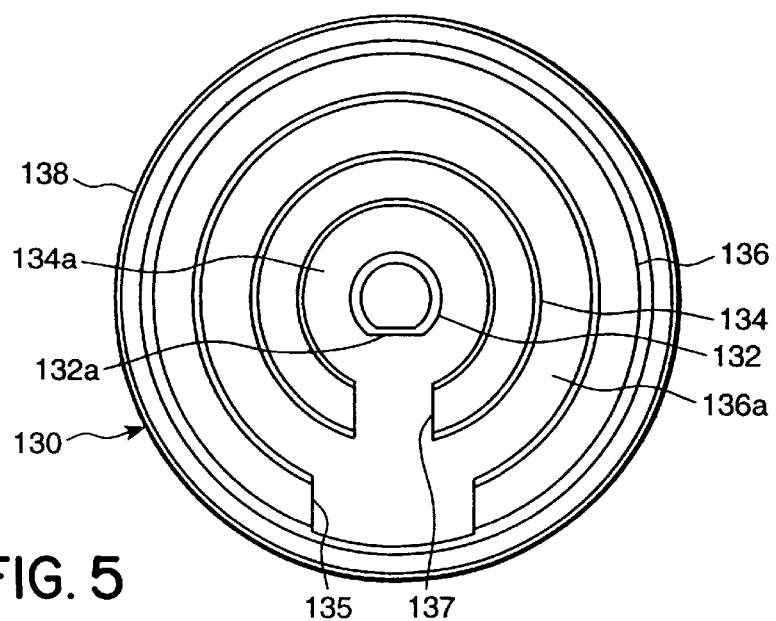
FIG. 5 is a top view of the preferred embodiment of the cold sink.

As shown in FIGS. 3A, 5 and 7, cold sink 130 preferably comprises a substantially circular base 138, a substantially circular intermediate portion 277 above the base, and one or more upstanding elements extending above intermediate portion 277, which define a convection current reducing structure. Preferably, a plurality of spaced apart, concentric rings are used although a variety of upstanding structures, and shapes therefor, could be employed. For example, such upstanding structures could include a substantially cylindrical center post 132, an intermediate annular ring 134, disposed radially outwardly from the center post 132, and an outer circular ring 136 disposed radially outwardly from the intermediate circular ring 134. The center post 132 and rings 134 and 136 of cooling member 130 are substantially cylindrical, but gradually taper in cross-section from base 138 toward the upper tips thereof.

The cover member 232, which is constructed with concentric portions which correspond to the shape of the cold sink 130, is also slightly tapered in each section so as to be easily installed on cold sink 130. The cold sink 130 and the cover member 232 are each respectively sized so that when the cover member 232 is force fit on and thus matingly placed over the cold sink 132 in a snug fit manner, gaps 234 exist between the top edges of the inside surface of the cover member 232 and the top surfaces of the central post 132, the intermediate circular ring 134, and the outer circular ring 136. In addition, another series of gaps 235 exist between the bottom edges of the inside surface of the cover member 232 and the annular surface adjacent the base 138 defined between the central post 132 and the intermediate circular ring 134 and the surface between the intermediate circular ring 134 and the outer circular ring 136. Gaps 234 and 235 help ensure that cover member 232 does not bottom out by contacting either the top surfaces or the bottom of the base 138 of the cold sink 130. This also helps ensure that the sides of the orbital sections of the cover member 232 and the sides of the central post 132 and the annular rings 134, 136 achieve and remain in substantially tight surface-to-surface mating contact thereby ensuring good heat conduction regardless of expansion or contraction of the cover 232 due to temperature changes. Alternatively, if sizing tolerances are sufficiently tight, good surface to surface contact between cold sink 130 and cover member 232 can be achieved even if gaps 234 and 235 are not provided.

Outer annular ring 136 and intermediate annular ring 134 define a quiescent region 136a therebetween, and intermediate annular ring 134 and center post 132 define another quiescent region 134a therebetween. Quiescent areas 134a and 136a are areas in which convection currents, caused by temperature differentials between the top and bottom of the tank, are eliminated or minimized, thus facilitating ice formation around cold sink 130. In its broadest aspects, a cold sink according to the present invention could comprise a single raised or recessed element or structure, such as ring 136. Also, while one or more circular structures are preferred, other noncircular shapes could be used as long as the structure defines an area that is sufficiently enclosed or shielded to create the desired quiescent region. The configuration shown represents the presently contemplated preferred embodiment.

Presently preferred dimensions of the embodiment shown in FIG. 3A are as follows: Base portion 138 has a diameter of 3.375" and a thickness of 0.401". Intermediate portion 277 has a diameter of 3.04" and a thickness of 0.499". Outer ring 136 has an outside diameter and thickness at the bottom end thereof of 3.014" and 0.34", respectively, and at the top end thereof of 2.94" and 0.253", respectively. Outer ring 136 extends 1.425" above intermediate portion 277. Intermediate ring 134 has an outside diameter and thickness at the bottom end thereof of 1.76" and 0.322", respectively, and at the top end thereof of 1.698" and 0.26", respectively. Intermediate ring 134 extends 1.175" above intermediate portion 277. Center post 132 has a diameter of 0.517" at the bottom end thereof and a diameter of 0.46" at the top end thereof and extends 1.075" above intermediate portion 277.

Both the intermediate circular ring 134 and the outer circular ring 136 are preferably discontinuous structures. That is, the intermediate circular ring 134 includes an opening 135, and the outer circular ring 136 has an opening 137. Openings 135, 137 are radially aligned and extend toward the dispensing valve assembly 73. Ice block formation adjacent these openings is both modified in shape and retarded in size so that the resulting ice block surrounding the cold sink does not interfere with dispensing of water via the valve assembly 73.

Center post 132 preferably has formed thereon a flat surface 132a, the purpose of which will be described below.

In the broadest aspects of the present invention, cold sink 130 could operate directly through opening 26 without a cover, such as cover member 232, as long as there is a suitable fluid seal, such as a gasket or O-ring, between the cold sink and the tank 24. Further, the tank 24 would not have to be removable. In the preferred embodiment, however, the separate cover 232 is provided as part of a water sealing arrangement for tank 24 via O-ring 254. When no cover was employed, when the cold sink functioned directly with water in the tank, when a cover was provided over the cold sink but the tank was not removable, or other combinations thereof, the circuit would continue to function to provide suitable operational control over the functioning of the system including the cold sink, the fan, or both.

Cover member 232 has a wide flange 232b at its bottom, which is employed to seal with bottom portion 25 via a locking ring 252 and O-ring 254 as illustrated in FIGS. 3 and 8. As a result, cover 232 becomes a removable part of the main tank 24 and prevents water in the tank from leaking out opening 26. This structure also permits easy removal of tank 24, and enables the simple and easy cleaning or repair of all surfaces in contact with the water. The wide flange 232b has some resiliency to permit cover 232 to tightly engage cold sink 130 over a range of relative axial positions between cold sink 130 and main tank 24 and over a range of tolerances of the parts. The cover 232 is preferably made of polypropylene or polyethylene although other moldable materials, including plastic or metal materials, could be used that would function in the temperature environment of this invention. It should also be understood that cold temperatures cause at least some shrinkage of the cover 232 on to cold sink 130, thus producing a tighter fit between cold sink 130 and cover 232.

As depicted in FIGS. 1, 3A and 8, cover 232 fits through opening 26 in the bottom surface 25 of tank 24, and thus extends into tank 24. Cover 232 fits onto tank 24 with engaging member 232a fitting into recess 24a formed in the lip of projecting portion 24c, which extends from the under surface of tank 24 (see FIG. 8). Grooves 24b are formed on the outer surface of projecting portion 24c. Locking ring 252 includes inner projections that interact with grooves 24b to lock cover 232 to tank 24. An O-ring 254 provides a fluid-tight seal between cover 232 and tank 24. O-ring 254 fits into recess 251 formed on the under surface of tank 24 interior to projecting portion 24c. Because cover member 232 is formed separately from tank 24, cover 232 can be made of thinner plastic than tank 24, which provides better thermal contact between cold sink 130 and the water in tank 24 or even a different material from that used to form tank 24. Alternately, cover 232 can be molded integrally with tank 24.

As mentioned above, the intermediate and outer circular rings 134 and 136 of the cold sink 130 have openings 135 and 137, respectively, formed therein. The openings 135 and 137 define air pockets 238a, 238b, respectively, between cold sink 130 and cover 232 (see FIG. 1). Air pockets 238a and 238b are aligned radially in the direction of valve assembly 73. Air pockets 238a and 238b act as an insulator between the cold sink and the cover member. Due to the presence of the air pockets, the ice block 155 that forms around cooling body 233 has a flattened or recessed portion 156 where the ice block fails to develop or develops at a different rate and manner. (FIGS. 15A and 15B) The ice is less likely to build up enough to interfere with the action of proportioning valve assembly 73 or the flow of liquid in the area around the valve assembly 73.

An air pocket 238c, as in FIG. 1, is defined between flat area 132a, shown in FIG. 5, of center post 132 and cover member 232. The purpose of air pocket 238c as well as air pockets 238a and 238b formed between openings 135 and 137, is to allow air between center post 132 and cover member 232 to prevent the creation of a suction vacuum therebetween, which can make removal of the cover member from the cold sink 130 difficult. Air pocket 238b, while contributing to ice block control as described above, also prevents a vacuum from forming between cover member 232 and the remainder of cold sink 130.

As shown in FIGS. 1, 3A, 3B, and 7 cold sink 130 directly contacts thermoelectric module 131. A pair of neoprene or other form of a sealing washers 242a and 242b surround module 131 and provides a moisture seal to protect the module and between the hot and cold sinks, respectively. Washers 242a and 242b preferably have cut out center portions of the same size and shape as module 131. For example, as shown in FIG. 7, washers 242a and 242b have square openings for accommodating square module 131. The module 131 and the accommodating openings in washers 242a and 242b may have shapes other than square.

Washers 242a and 242b extend radially beyond cold sink 130 and extend beneath a neoprene insulator ring 244. Ring 244 fills the area within the open bottom area of shell 12 adjacent the outer periphery of cold sink 130. Thus, ring 244 rests on top of and provides additional pressure against sealing washers 242a and 242b, and surrounds the base of cold sink 130.

The base of cold sink 130 includes a shoulder 278, that extends beneath a circumferential lip 276 extending around and defining opening 280 in shell 12, with an O-ring 270 positioned between shoulder 278 and lip 276 to provide further sealing about cold sink 130 and shell 12.

Cold sink 130 is secured to heat sink 246, which includes fins 248. Thermoelectric module 131 is disposed between the bottom surface of cold sink 130 and the upper surface of heat sink 246. Fins 248 of heat sink 246, in conjunction with fan 140, serve to dissipate heat from the module 131. Cold sink 130 can be attached in a number of approaches but the preferable way is to secure heat sink 246 by a plurality of screws 250. For example, two screws 250 hold heat sink 246 to cold sink 130, with the screws 250 penetrating from the underside of heat sink 246 into cooling member 130. Bolts 133 hold the heat sink 246 to bosses 139 in the lower end of upper shell 12.

A cold side temperature sensor, such as thermistor 142 shown in FIG. 3A, is mounted on cold sink 130. An overtemperature sensor, such as thermistor 272, could be mounted on a circuit board, on heat sink 246 or at other locations. Temperature sensors can also be employed to monitor ambient air temperatures adjacently around the water chiller, such as at 143 in FIG. 1 and overtemperature monitoring could be achieved by using such an ambient air temperature sensor rather than using a separate overtemperature sensor.

Control of cooling action is provided by varying the fan speed (and as fan speed is lowered that will reduce fan noise during a maintenance period of operation when the tank water has been fully chilled and/or an ice block has been formed with the desired size and shape), by varying the current supplied to the thermoelectric module in response to varying heat loads, or by a coordinated control over both fan speed and module power. For example, a set point temperature could be set for the cold sink at about 18° F. for an ambient room air temperature of about 72° F. Once the ice block had formed and the cold sink temperature had been lowered or reached the 18° F. set point, then a desired size ice block will be under formation.

Several options would then be available to maintain the ice block at a consistent and desired size. For example, it would be possible to reduce fan speed to a reduced level, perhaps about 50% of full speed, and to then modulate power to the thermoelectric module 131. Alternatively, fan speed and power to the module could be controlled together.

Further, the fan speed could be controlled by changes in ambient air temperatures, while power supplied to the module could be separately controlled relative to variations in ambient air temperature combined with monitored temperature of the cold sink to maintain a set point for a given ambient air temperature. The latter could be further modified by having fan operation also include sensing the power being used by module and as power usage increased, fan speed could be relatively increased. As ambient room temperature rises, for example to 85° F., the set point for the cold sink would move inversely and drop several degrees. Conversely, should ambient room temperature drop, then the cold sink set point would have to rise in a relative manner to help prevent a freeze-up situation.

Figure 16A:
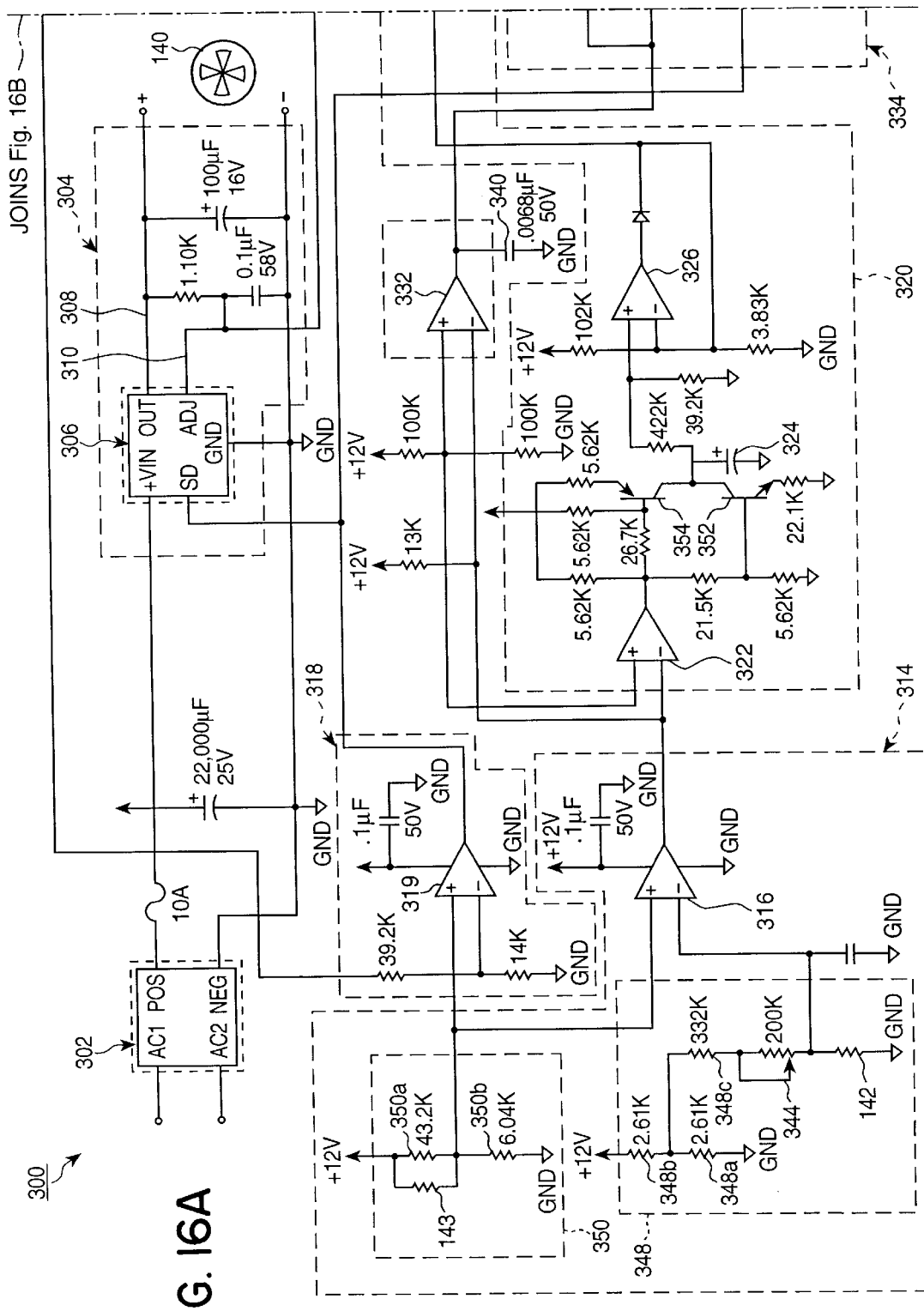
FIG. 16 is a circuit diagram illustrating the control circuit for the system.

FIG. 16 illustrates an exemplary arrangement of conventional circuit elements for controlling the operating levels of the thermoelectric module and the fan. Circuit 300 of FIG. 16 represents the preferred system for controlling the ice forming assembly of the present invention but does not represent the only system suitable for controlling the ice block forming assembly.

Circuit 300 preferably incorporates the individual elements on a printed circuit board located in the base of the lower shell 13 adjacent heat sink 246. The dispenser is plugged into a wall outlet to provide power to power supply 147. The transformer and rectifier turn the input ac power into dc power.

Comparator circuit 314 of control circuit 300 includes a differential comparator 316 that compares the voltage across the cold sink thermistor 142 with the voltage across the ambient air monitoring thermistor 143. When the system is first started, thermistors 142 and 143 are at room temperature so that thermoelectric module 131 is driven at full power to reduce the temperature of cold sink 130. In addition, the fan 140 is ramped up to full power.

The specific operation of preferred control circuit 300 will now be described.

For clarity, transformer 243 is not shown in control circuit 300. Control circuit 300 includes rectifier 302, preferably a full-wave bridge rectifier. Rectifier 302 and associated components create an unregulated DC voltage.

A fan voltage regulator 304 preferably includes an adjustable voltage regulator 306. Fan voltage regulator 304 controls voltage to fan 140 and performs a smoothing function to provided a regulated voltage supply to fan 140. Voltage at pin 310 of the adjustable voltage regulator 306 is maintained at a constant predetermined level, such as 1.235V. This maintains a constant voltage, nominally 6 volts, to the fan 140.

The voltage at pin 310 is amplified and regulated by power supply 312, which provides a constant 12 volt DC power source to the remainder of the control circuit 300.

Comparator circuit 314 compares the voltage across ambient thermistor 143 with the voltage at the cold sink thermistor 142. Circuit 314 includes potentiometer 344 which permits manual adjustment of the set point of the system to compensate for circuit manufacturing tolerances and extreme environmental conditions. Potentiometer 344, as shown in FIG. 3A, is set by inserting a screwdriver or an appropriate tool through a guide tube 344a that is accessible via an access opening 344b in the bottom as in FIG. 2. Alternatively, potentiometer 344 could be provided with a connection shaft and an outer connection, including a suitable indicator, that would cooperate with a temperature gauge molded into the bottom about access opening 344b. The potentiometer could be used in place of one of the temperature sensors to provide consistent set point for the cold sink or act as a pre-set ambient temperature based on average room temperatures. The chiller system could also be set to a very minimal setting as when the user was going on vacation and room temperatures would be low, or the chiller system would be left unattended.

Figure 17:
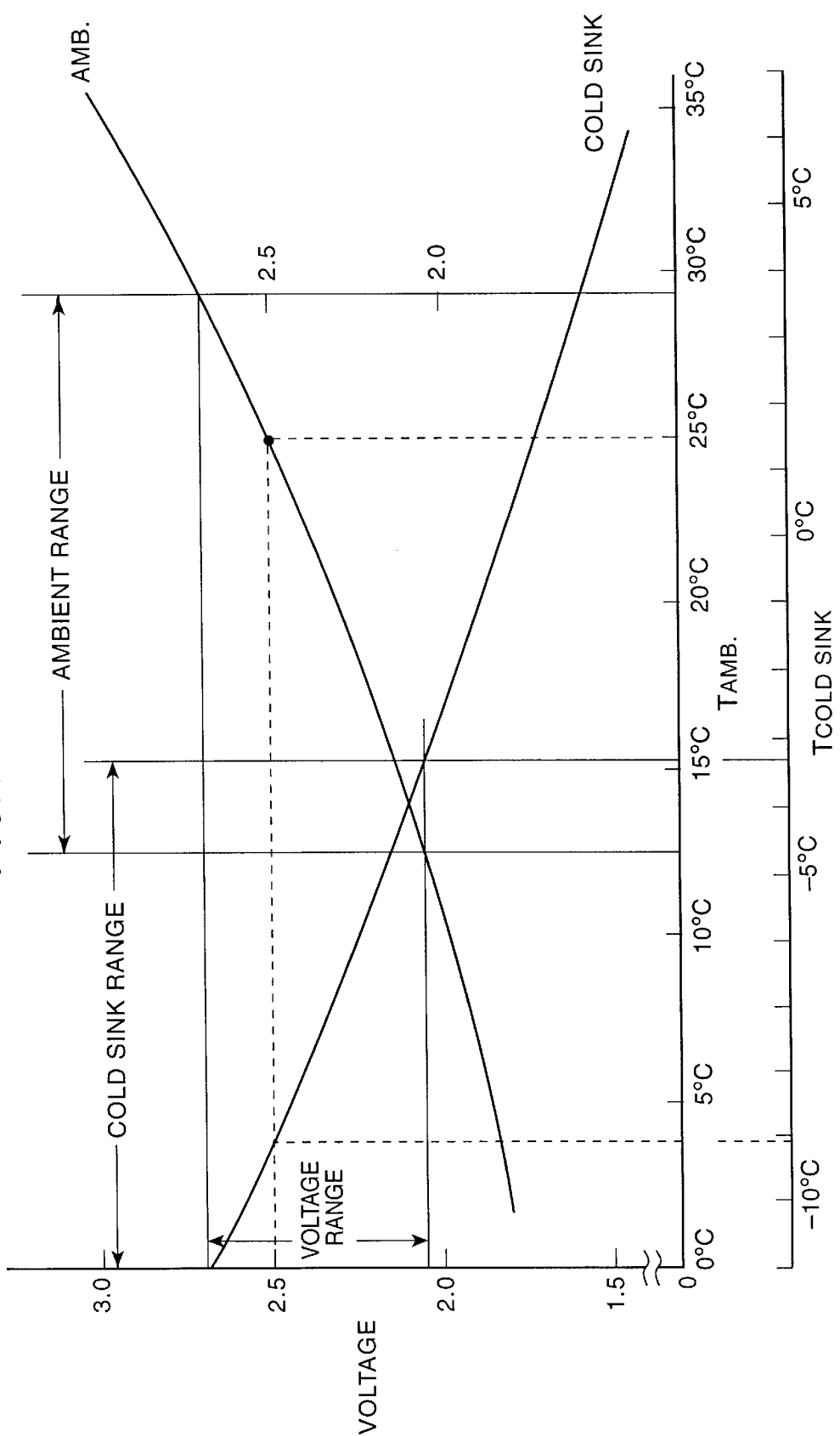
FIG. 17 is a plot of ambient thermistor and thermoelectric module thermistor voltage versus cold sink and ambient temperatures.
Figure 18A:
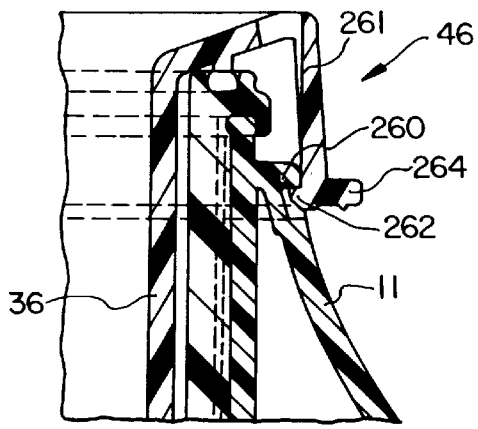
FIGS. 18A–18D are views illustrating the latching mechanism of the preferred embodiment.
Figure 18B:
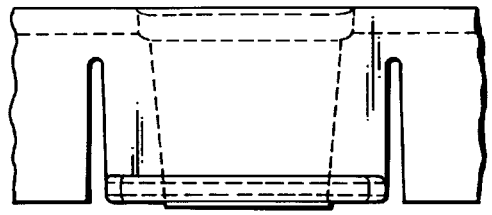
Figure 18C:
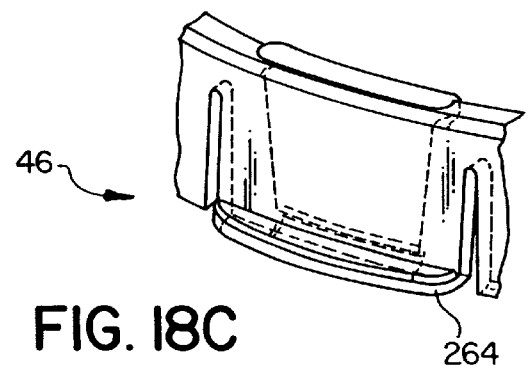
Figure 18D:
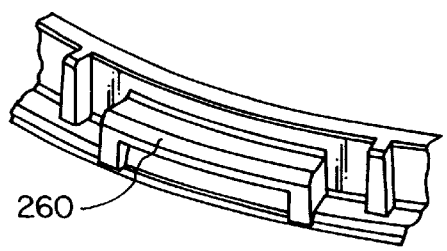

FIG. 17 shows a presently preferred relationship between cold sink thermistor voltage and cold sink temperature and ambient thermistor voltage and ambient temperature. As shown in FIG. 17, cold sink thermistor voltage decreases with increasing cold sink temperatures, whereas ambient thermistor voltage increases with increasing ambient temperatures. In the preferred embodiment, "ambient thermistor voltage" is actually the voltage across an ambient resister network 350 which includes ambient thermistor 143 and various associated resistors, 350a and 350b, shown in FIG. 16. Similarly, "cold sink thermistor voltage" is the voltage across a cold sink resister network 348 which includes cold sink thermistor 142 and its various associated resistors, 348a, 348b, and 348c, including variable resistor 344. The relationship between ambient and cold sink thermistor voltages and ambient and cold sink temperatures, respectively, depends on the thermistors and resistors used. The curves shown in FIG. 17, for example, result from resistor networks having resisters and thermistors having the following values:

Thermistor 142=50 kΩ at 25° C.
Thermistor 143=50 kΩ at 25° C.
Resistor 348a=2.61 kΩ
Resistor 348b=2.61 kΩ
Resistor 348c=322 kΩ
Variable Resistor 344=200 kΩ potentiometer
Resistor 350a=43.2 kΩ
Resistor 350b=6.04 kΩ

Control circuit 300 has been designed to equalize the respective voltages at the ambient thermistor and the cold sink thermistor. For example, as shown in FIG. 17, for an ambient temperature of 25° C., on the "T AMB" scale in FIG. 17, the ambient thermistor voltage would be approximately 2.5V. In order for the cold sink thermistor voltage to be equalized at 2.5V, the temperature at the cold sink thermistor must be approximately −9° C. as shown by the bottom temperature scale "T cold sink". If the temperature sensed at the cold sink thermistor is different from −9° C., i.e., the voltage at the cold sink thermistor is different from 2.5V, the power to the thermoelectric module 131 and/or the power to the cooling fan 140 will be varied appropriately until the cold sink thermistor voltage is 2.5V.

The system of the present invention has a preferred voltage range which corresponds to a preferred operating temperature range. As shown in FIG. 17, the preferred voltage range is approximately 2.1 V to 2.7 V, which corresponds to an ambient temperature range of approximately 13° C. to approximately 29° C. or a Δ of 16° C. and a cold sink temperature range of approximately −11° C. to approximately −3.2° C. or a Δ of approximately 7.8° C.

When cold sink thermistor voltage is less than ambient thermistor voltage (i.e., the cold sink is too warm), differential comparator 316 switches to high. Conversely, when cold sink thermistor voltage is greater than ambient thermistor voltage (i.e., the cold sink is too cold), differential comparator 316 switches to or remains at low.

Control circuit 300 also preferably includes an overtemperature circuit 318 to cut off the circuit if the system overheats. The voltage across ambient thermistor 143 is compared to a reference voltage in a differential comparator 319 in overtemp shutdown circuit 318. When the voltage across thermistor 143 indicates a temperature greater than a predetermined maximum, such as, for example, 115° F., the differential comparator 319 causes the thermoelectric module 131, and perhaps also fan 140, to shut off. Overtemp circuit 318 preferably monitors ambient thermistor 143, but temperature at any location within the ice block forming assembly 124 could be used for the overtemp circuit 318.

Fan speed control circuit 320 takes output from the comparator circuit 314 to slowly ramp voltage to fan 140 up or down as necessary. Because ambient temperature fluctuates, it is desirable to slowly vary fan speed in response to changing ambient temperature so as to avoid the annoying noise associated with frequent sudden surges in fan speed. Alternatively, the control feature can be delayed.

Fan speed control circuit 320 preferably includes inverter 322, capacitor 324, amplifiers 326 and 328, and transistors 330, 352, and 354. The charge in capacitor 324 slowly increases in response to the signal from inverter 322 via the transistor circuit which includes transistors 352 and 354. Below a threshold level, capacitor 324 has no effect on transistor 330. When the charge in capacitor 324 reaches a level sufficient to enable amplifier 326 such that its voltage increases as capacitor voltage 324 increases, amplifiers 326 and 328 work in conjunction with transistor 330 to sink current from pin 310 of voltage regulator 306. To maintain constant voltage at pin 310, voltage at pin 308 increases, thereby increasing voltage at fan 140 and thus fan speed.

An oscillator circuit 334 connects into a thermoelectric module driver 336, which preferably comprises a mosfet connected to the thermoelectric module 131. Oscillator 334 switches the mosfet on and off at a frequency of preferably 1 kHz, thus maintaining the thermoelectric module 131 at ½ power without requiring an additional, heat generating resistor.

Module driver 336 is connected to inverter 332, via differential comparator 346, which inverts the signal from comparator circuit 314. When more power is required in the thermoelectric module 131, differential comparator 332 discharges capacitor 340, thus causing differential comparator 346 to go to high, thereby turning the mosfet of driver 336 to a full on state (i.e., no longer oscillating) thereby increasing power to thermoelectric module 131.

Transistor 338 within the oscillator circuit 334 is connected to overtemp shutdown circuit 318. When an overtemp condition is indicated, transistor 338 shuts down the mosfet of the module driver circuit 336, overriding all other signals.

Finally, circuit 300 preferably includes resistor 342, which ensures that a small current always flows to the thermoelectric module, even during an overtemp shutdown, to prevent the thermoelectric module from reversing polarity.

Thus, control circuit 300 controls the size of the ice block that forms on cooling body 233 by regulating the thermoelectric module 131 and/or fan 140.

As alternatives to the above-described preferred control system, operation of the ice block forming assembly could be accomplished by keeping fan speed constant and varying the power supplied to the thermoelectric module or by keeping the power to the thermoelectric module constant and varying fan speed.

The water chiller of the preferred embodiment is easy to disassemble, and can be cleaned by taking the dispenser apart. The main tank 24 may be removed by unfastening latches 46 and removing thermal barrier 35. (FIG. 1) In the preferred embodiment, three latches 46 are provided although any number could be used. This releases valve assembly 73 which can then be removed. Then main tank 24 can be removed with cover 232. As described above, cover 232 can be removed from main tank 24 by turning locking ring 252.

Latch 46 is illustrated in FIGS. 18A–18D. Latch 46 is attached to the top of sidewall 36 of thermal barrier 35 and is continuous therewith. Latch 46 includes movable member 261, which connects with sidewall 36. Movable member 261 has a T-shaped end, formed by portions 262 and 264. Extending from the upper wall of outer housing 11 is projection 260, which tightly engages with portion 262. Latch 46 is configured so as downward and outward pressure on projection 264 releases latch 46.

There has been described a thermoelectric water-chiller system which provides efficient cooling of bottled water for personal consumption and use, with quiet, reduced-noise operation after the water has been fully chilled. By reducing fan speed as the water becomes cool, less dust and other foreign matter will collect on the heat sink so that efficient cooling performance is maintained for a longer period of time. The system is designed to enable ready and simple disassembly for periodic cleaning of the whole device. The system is not restricted to use with bottled water, and can be adapted for point-of-use type water-treatment systems. For example, the present invention may be employed with filter systems and can be used to cool filtered water. Also, water fountains, such as those found in offices, schools, etc., may utilize the present invention to chill the water to be dispensed therefrom. Furthermore, features found in either embodiment may be substituted in the other embodiment within the scope of this invention.

Having now fully described the present invention, it will be apparent to one of ordinary skill in the art that many changes and modifications can be made thereto without departing from the spirit or scope of the present invention as set forth herein including the appended claims.

What is claimed is:

1. A fluid chiller system comprising:

a housing;

a tank for holding a fluid, said tank being supported on and extending within said housing;

a dispensing valve assembly extending from said tank outwardly through said housing;

a cooling unit, sealed to said tank, for cooling at least a portion of the fluid within said tank;

temperature sensors to monitor temperatures at two different locations with respect to said chiller system, one of said sensors monitoring temperature of ambient air surrounding said fluid chiller system; and a control system to control operation of said cooling unit in response to a comparison of the temperatures monitored at the two different locations.

2. The fluid chiller system of claim 1 wherein one of said sensors monitors temperature of said cooling unit.

3. The fluid chiller system of claim 1 wherein one of said sensors monitors temperature in the fluid within said tank.

4. The fluid chiller system of claim 1 wherein said cooling unit includes a cold sink and one of said sensors monitors the temperature of said cold sink.

5. The fluid chiller system of claim 1 wherein said temperature sensors comprise thermistors.

6. A fluid chiller system comprising:

a housing;

a tank for holding a fluid, said tank being supported on and extending within said housing;

a dispensing valve assembly extending from said tank outwardly through said housing;

a cooling unit, sealed to said tank, for cooling at least a portion of the fluid within said tank; and a control system to control operation of said cooling unit in response to varying temperature conditions, wherein said control system monitors cooling unit and ambient air temperature variations and controls the operation of said chiller system based upon a comparison of the monitored cooling unit and ambient air temperatures.

7. A fluid chiller system comprising:

a housing;

a tank for holding a fluid, said tank being supported on and extending within said housing;

a dispensing valve assembly extending from said tank outwardly through said housing;

a cooling unit, sealed to said tank, for cooling at least a portion of the fluid within said tank;

temperature sensors to monitor temperatures at two different locations with respect to said chiller system; and a control system to control operation of said cooling unit in response to a comparison of the temperatures monitored at the two different locations, wherein said cooling unit includes a fan and a thermoelectric module and said control system includes a temperature comparator for comparing the temperatures monitored at the two different locations and at least one of a fan speed regulator for varying fan speed in response to said comparator signal and a thermoelectric module driver for varying power to said thermoelectric module in response to said comparator signal.

8. The fluid chiller system of claim 7 wherein said control system includes a fan speed regulator for varying fan speed in response to said comparator signal and a thermoelectric module driver for varying power to said thermoelectric module in response to said comparator signal.

* * * * *